(12) United States Patent
Fujita et al.

(10) Patent No.: US 11,670,660 B2
(45) Date of Patent: Jun. 6, 2023

(54) PIXEL ARRAY INCLUDED IN AUTO-FOCUS IMAGE SENSOR AND AUTO-FOCUS IMAGE SENSOR INCLUDING THE SAME

(71) Applicant: SAMSUNG ELECTRONICS CO., LTD., Suwon-si (KR)

(72) Inventors: Masato Fujita, Hwaseong-si (KR); Kyungho Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 238 days.

(21) Appl. No.: 16/825,245

(22) Filed: Mar. 20, 2020

(65) Prior Publication Data

US 2021/0028204 A1    Jan. 28, 2021

(30) Foreign Application Priority Data

Jul. 25, 2019    (KR) .................. 10-2019-0090165

(51) Int. Cl.
*H01L 27/148*    (2006.01)
*H01L 27/146*    (2006.01)

(52) U.S. Cl.
CPC .... *H01L 27/1463* (2013.01); *H01L 27/14605* (2013.01); *H01L 27/14612* (2013.01); *H01L 27/14623* (2013.01); *H01L 27/14627* (2013.01); *H01L 27/14645* (2013.01); *H01L 27/14689* (2013.01); *H01L 27/14812* (2013.01)

(58) Field of Classification Search
CPC ......... H01L 27/14605; H01L 27/14612; H01L 27/14623; H01L 27/14627; H01L 27/1463; H01L 27/14645; H01L 27/14689; H01L 27/14812
See application file for complete search history.

(56) References Cited

U.S. PATENT DOCUMENTS

| | | |
|---|---|---|
| 8,481,358 B2 | 7/2013 | Wang |
| 8,853,610 B2 | 10/2014 | Adachi et al. |
| 9,184,208 B2 | 11/2015 | Kobayashi et al. |
| 9,520,425 B2 | 12/2016 | Hynecek |
| 9,781,367 B2 | 10/2017 | Ishii |
| 9,942,461 B2 | 4/2018 | Kim et al. |

(Continued)

FOREIGN PATENT DOCUMENTS

| | | |
|---|---|---|
| JP | 5219555 B2 | 6/2013 |
| JP | 2015-154188 A | 8/2015 |

*Primary Examiner* — Herve-Louis Y Assouman
*Assistant Examiner* — Christopher M Roland
(74) *Attorney, Agent, or Firm* — Sughrue Mion, PLLC

(57) ABSTRACT

A pixel array included in an auto-focus image sensor includes a substrate, a plurality of pixels, a deep device isolation region and a plurality of first ground regions. The substrate includes a first surface on which a gate electrode is disposed and a second surface opposite to the first surface. The plurality of pixels are disposed in the substrate, and include a plurality of first pixels configured to detect a phase difference and a plurality of second pixels configured to detect an image. The deep device isolation region is disposed in the substrate, extends substantially vertically from the second surface of the substrate to isolate the plurality of pixels from each other. The plurality of first ground regions are disposed adjacent to the first surface in the substrate and adjacent to only at least some of the plurality of first pixels.

18 Claims, 38 Drawing Sheets

(56) References Cited

U.S. PATENT DOCUMENTS

| | | | |
|---|---|---|---|
| 2014/0054662 A1* | 2/2014 | Yanagita | H01L 27/1462 438/73 |
| 2016/0006965 A1* | 1/2016 | Lee | H01L 27/14605 257/292 |
| 2016/0133865 A1* | 5/2016 | Yamaguchi | H04N 5/378 257/40 |
| 2016/0295139 A1* | 10/2016 | Ishii | H04N 5/361 |
| 2018/0350856 A1 | 12/2018 | Masagaki et al. | |

* cited by examiner

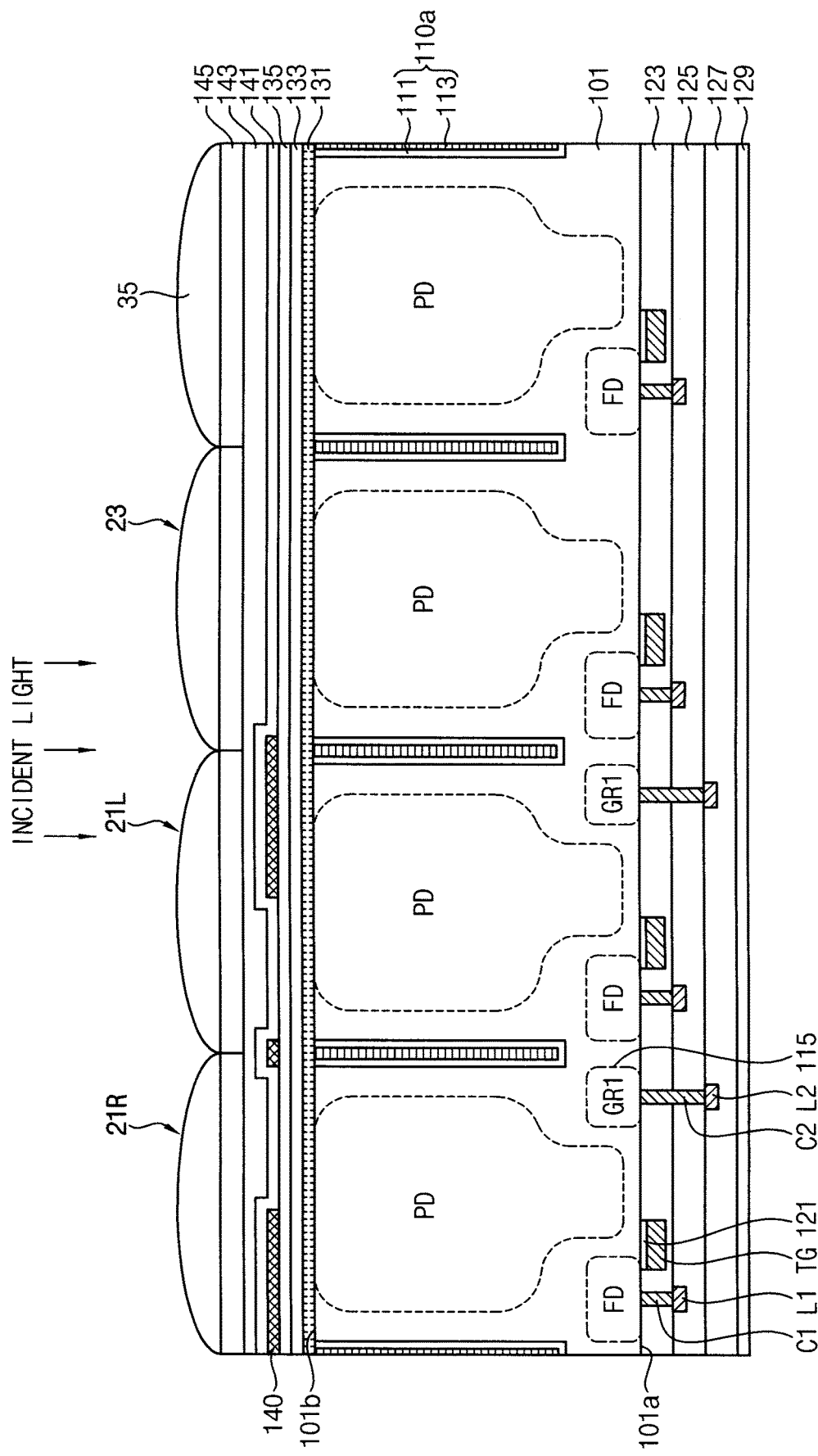

PIXEL ARRAY INCLUDED IN AUTO-FOCUS IMAGE SENSOR AND AUTO-FOCUS IMAGE SENSOR INCLUDING THE SAME

CROSS-REFERENCE TO THE RELATED APPLICATION

This application claims priority under 35 USC § 119 to Korean Patent Application No. 10-2019-0090165, filed on Jul. 25, 2019 in the Korean Intellectual Property Office (KIPO), the contents of which are herein incorporated by reference in their entirety.

BACKGROUND

1. Field

Example embodiments relate generally to image sensors, and more particularly, to pixel arrays included in auto-focus image sensors and auto-focus image sensors including the pixel arrays.

2. Description of the Related Art

A complementary metal oxide semiconductor (CMOS) image sensor is an image capturing device manufactured using CMOS processes. The CMOS image sensor typically has lower manufacturing costs and a smaller pixel size than conventional charge coupled device (CCD) image sensors that typically utilize relatively high-voltage analog circuits. Accordingly, CMOS-type image sensors may have lower power consumption requirements relative to CCD-type image sensors. Moreover, with the continued improvement in performance of CMOS image sensors, CMOS image sensors are becoming more widely used in mobile electronic devices such as smart phones, tablet personal computers (PCs), and digital cameras.

In a digital image processing device such as a camera, it may be helpful to detect a focus control state of a photographing lens to automatically control a focus of the lens. To achieve this, a conventional digital image processing device includes an additional focus detecting device that is separate and/or different from an image sensor. In this case, costs of the focus detecting device and/or an additional optical lens may be increased and/or an entire size of the digital image processing device may be increased by the focus detecting device. To solve these problems, an auto-focus image sensor using a method of detecting a phase difference has been developed.

SUMMARY

At least one example embodiment of the disclosure provides a pixel array included in an auto-focus image sensor capable of having improved or enhanced full well capacity (FWC) characteristics.

At least one example embodiment of the disclosure provides an auto-focus image sensor including the pixel array and capable of having improved or enhanced FWC characteristics.

According to example embodiments, a pixel array included in an auto-focus image sensor includes a substrate, a plurality of pixels, a deep device isolation region and a plurality of first ground regions. The substrate includes a first surface and a second surface opposite to the first surface, a gate electrode being disposed on the first surface. The plurality of pixels are disposed in the substrate, and include a plurality of first pixels configured to detect a phase difference and a plurality of second pixels configured to detect an image. The deep device isolation region is disposed in the substrate, extends substantially vertically from the second surface of the substrate to isolate the plurality of pixels from each other. The plurality of first ground regions are disposed adjacent to the first surface in the substrate and adjacent to only at least some of the plurality of first pixels.

According to example embodiments, an auto-focus image sensor includes a pixel array and a plurality of column driving circuits. The pixel array generates a plurality of analog pixel signals based on incident light, the plurality of analog pixel signals representing phase difference information and image information. The plurality of column driving circuits are connected to a plurality of columns of the pixel array, and convert the plurality of analog pixel signals into a plurality of digital signals. The pixel array includes a substrate, a plurality of pixels, a deep device isolation region and a plurality of first ground regions. The substrate includes a first surface and a second surface opposite to the first surface, a gate electrode being disposed on the first surface. The plurality of pixels are disposed in the substrate, and include a plurality of first pixels configured to detect a phase difference and a plurality of second pixels configured to detect an image. The deep device isolation region is disposed in the substrate, extends substantially vertically from the second surface of the substrate to isolate the plurality of pixels from each other. The plurality of first ground regions are disposed adjacent to the first surface in the substrate and adjacent to only at least some of the plurality of first pixels.

According to example embodiments, a pixel array included in an auto-focus image sensor includes a substrate, a plurality of pixels, a deep device isolation region and a plurality of ground regions. The substrate includes a first surface and a second surface opposite to the first surface, a gate electrode being disposed on the first surface. The plurality of pixels are disposed in the substrate, and detect a phase difference and to detect an image. The deep device isolation region is disposed in the substrate, extends substantially vertically from the second surface of the substrate to isolate the plurality of pixels from each other. The plurality of ground regions are disposed adjacent to the first surface in the substrate and adjacent to only at least some of the plurality of pixels.

BRIEF DESCRIPTION OF THE DRAWINGS

The above and other aspects and features of the disclosure will become more apparent by describing in detail example embodiments thereof with reference to the attached drawings.

FIGS. 9, 10, 11, 12, 13, 14 and 15 are cross-sectional views of other examples of the pixel array included in the auto-focus image sensor taken along a line A-A' of FIG. 6.

DETAILED DESCRIPTION

Figure 1:
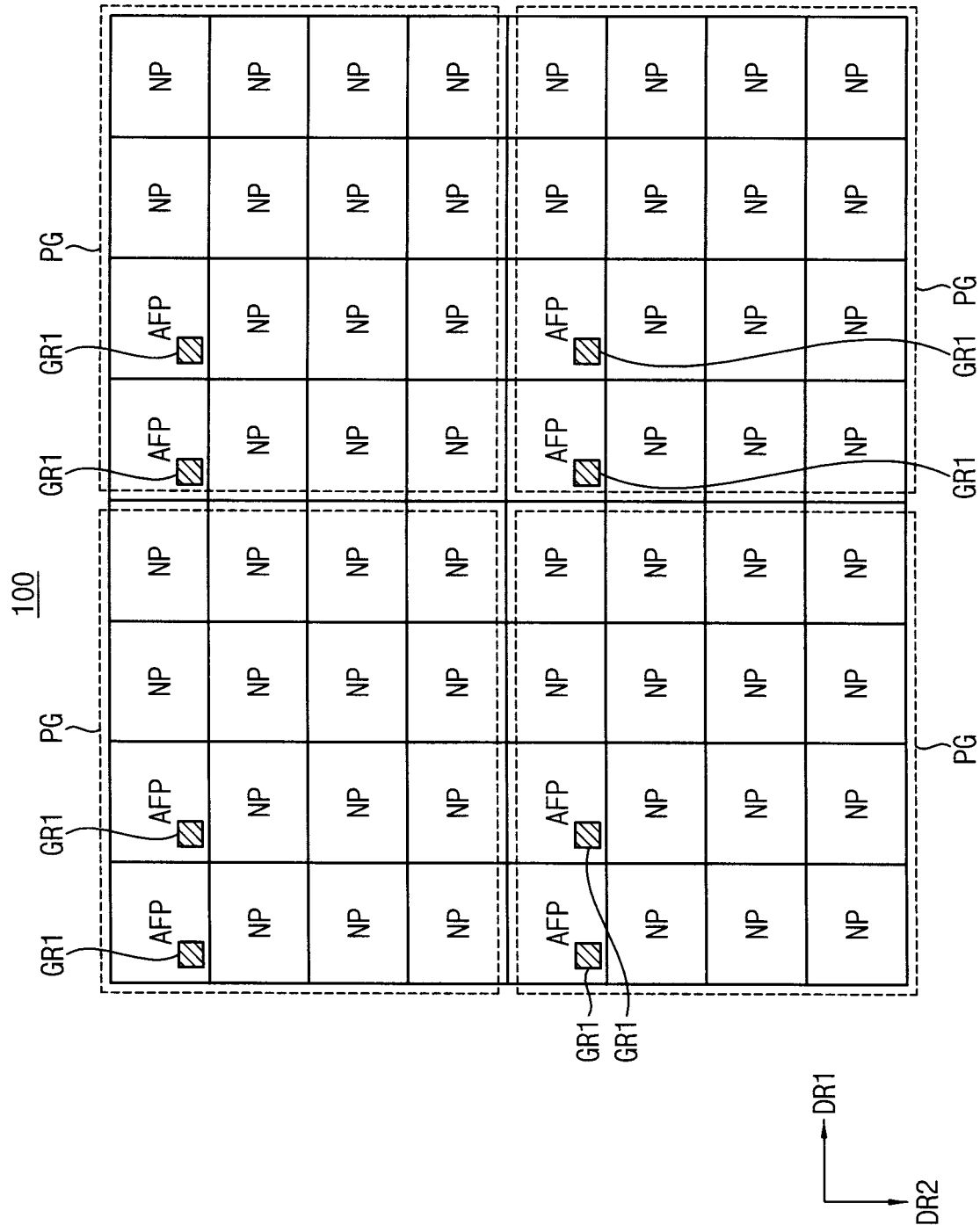
FIG. 1 is a plan view of a pixel array included in an auto-focus image sensor according to example embodiments.

Various example embodiments will be described more fully with reference to the accompanying drawings, in which example embodiments are shown. The disclosure may, however, be embodied in many different forms and should not be construed as limited to the embodiments set forth herein. Like reference numerals refer to like elements throughout the disclosure.

At least one of the components, elements, modules or units described herein may be embodied as various numbers of hardware, software and/or firmware structures that execute respective functions, according to an example embodiment.

FIG. 1 is a plan view of a pixel array included in an auto-focus image sensor according to example embodiments.

Referring to FIG. 1, a pixel array 100 included in an auto-focus image sensor includes a plurality of pixels and a plurality of first ground regions GR1.

The plurality of pixels include a plurality of first pixels AFP and a plurality of second pixels NP. The plurality of first pixels AFP are configured to detect a phase difference and obtain auto-focus (AF) information. The plurality of first pixels AFP may be referred to as auto-focus (AF) pixels. The plurality of second pixels NP are configured to detect an image. The plurality of second pixels NP may be referred to as normal pixels. The AF pixels AFP and the normal pixels NP may be disposed in one pixel array 100.

As will be described later with reference to FIG. 7, the plurality of pixels are formed or disposed in a substrate, and the pixel array 100 includes a deep device isolation region to isolate or separate the plurality of pixels from each other.

The plurality of first ground regions GR1 are disposed adjacent to at least some of or only at least some of the plurality of first pixels AFP. In an example of FIG. 1, the number of the plurality of first ground regions GR1 may be substantially equal to the number of the plurality of first pixels AFP, and the plurality of first ground regions GR1 may be disposed adjacent to all of the plurality of first pixels AFP. In other words, each of the plurality of first pixels AFP may include a respective one of the plurality of first ground regions GR1. To reduce a dark current, a reference voltage (e.g., a ground voltage) may be applied to the plurality of first ground regions GR1.

In some example embodiments, the plurality of first ground regions GR1 may be arranged uniformly and regularly throughout the pixel array 100.

The plurality of pixels may be divided into a plurality of pixel groups PG each of which includes at least one of the plurality of first pixels AFP and at least one of the plurality of second pixels NP. The plurality of pixel groups PG may be repeatedly arranged along a first direction DR1 and a second direction DR2 crossing (e.g., substantially perpendicular to) the first direction DR1. The plurality of pixel groups PG may include the same number of the first pixels AFP.

Although FIG. 1 illustrates an example where one pixel group PG includes 4×4 pixels, in particular two first pixels AFP and fourteen second pixels NP, example embodiments are not limited thereto, and a configuration of the pixel group PG may be variously changed or modified according to example embodiments.

The pixel array 100 included in the auto-focus image sensor according to example embodiments may be implemented such that the first pixels AFP for obtaining AF information and the second pixels NP for obtaining image information are disposed in one pixel array 100. In addition, to reduce the dark current, the first ground regions GR1 may be disposed only in the first pixels AFP and not in the second pixels NP. Accordingly, photoelectric conversion regions included in the second pixels NP may be expanded or enlarged even if a size of the pixels decreases, and thus the full well capacity (FWC) characteristics may be improved or enhanced.

Figure 2:
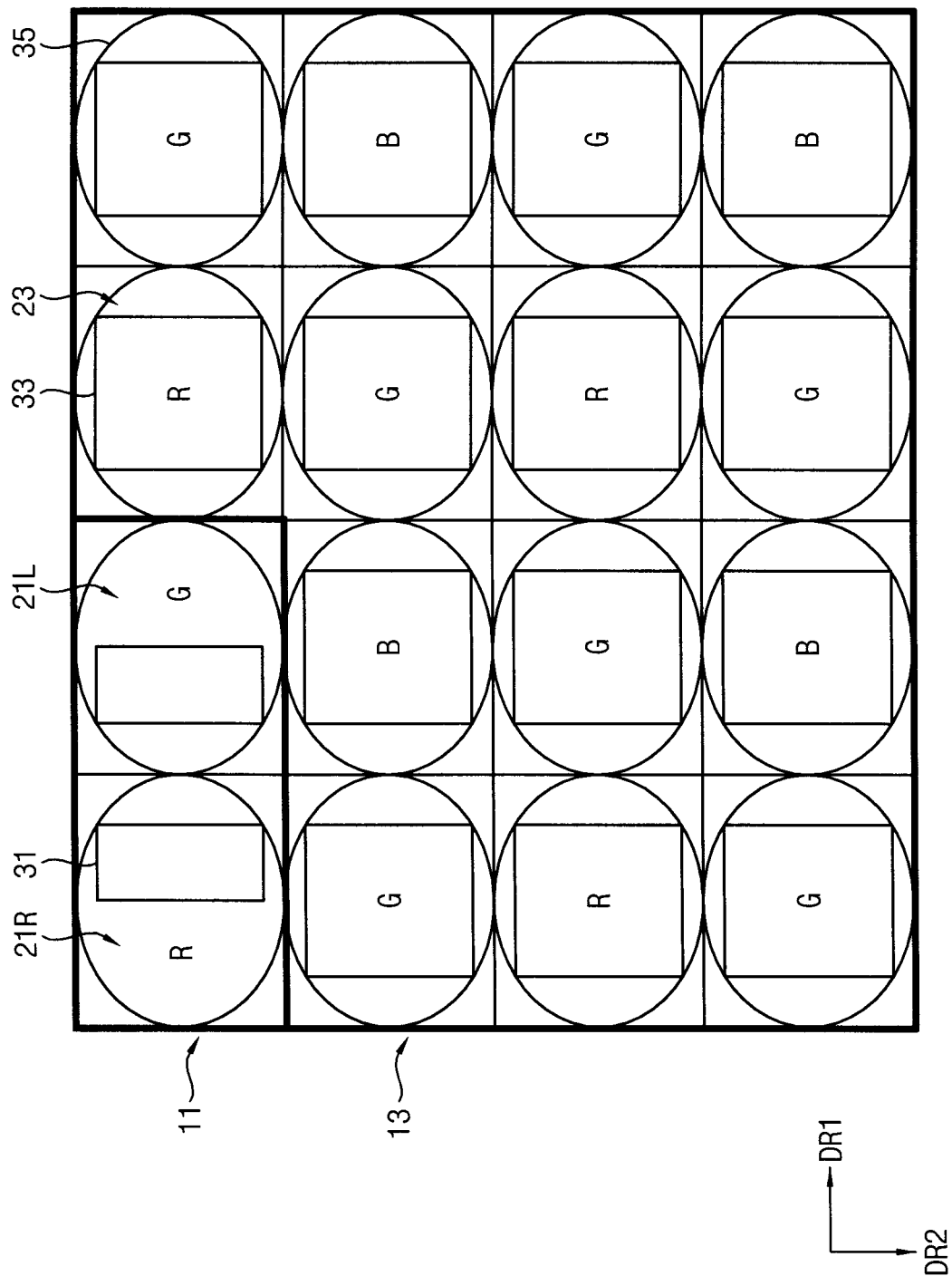
FIG. 2 is a plan view of a layout of a portion of the pixel array included in the auto-focus image sensor of FIG. 1.

FIG. 2 is a plan view of a layout of a portion of the pixel array included in the auto-focus image sensor of FIG. 1. For convenience of illustration, FIG. 2 illustrates a layout of one pixel group PG included in the pixel array 100 of FIG. 1.

Referring to FIGS. 1 and 2, the pixel array 100 included in the auto-focus image sensor may include a focus detecting region 11 and an image detecting region 13. The focus detecting region 11 may include a first AF pixel 21R and a second AF pixel 21L that are adjacent to each other and configured to detect a phase difference. The image detecting region 13 may include normal pixels 23 that are used to detect an image.

A color filter array including a plurality of color filters may be disposed on the focus detecting region 11 and the image detecting region 13. For example, the color filter array may be a Bayer pattern array consisting of red (R), green (G) and blue (B). However, example embodiments are not limited thereto, and the color filter array may adopt a complementary color system (e.g., a system using magenta, cyan and yellow) or may further include a white (W) or transparent filter. Color filters disposed on the AF pixels 21R and 21L may not be used to implement colors, and the color filters may also be formed on the AF pixels 21R and 21L for the purpose of convenience in a process of forming the color filter array. A micro lens array including a plurality of micro lenses 35 may be disposed on the color filter array.

Although not illustrated in FIG. 2, the color filters disposed on the AF pixels 21R and 21L of the focus detecting region 11 may be omitted according to example embodiments.

A light shielding pattern that controls the light-receiving amounts of at least the AF pixels 21R and 21L may be disposed under the color filter array. Thus, the light shielding pattern may include a plurality of first openings 31 formed on the AF pixels 21R and 21L. In addition, the light shielding pattern may further include a plurality of second openings 33 formed on the normal pixels 23. An area of each of the first openings 31 may be smaller than an area of each of the second openings 33. For example, the area of each of the first openings 31 may be about 50% of the area of each of the second openings 33. Each of the first openings 31 may be disposed to be one-sided from a light axis along which light is received. The first openings 31 of the first and the second AF pixels 21R and 21L adjacent to each other may be disposed to be horizontally symmetric. The first openings 31 of the light shielding pattern may reduce the amount of light incident on each of the AF pixels 21R and 21L in comparison with the amount of light incident on each of the normal pixels 23. In other words, the amount of the light incident on each of the AF pixels 21R and 21L may be smaller than the amount of the light incident on each of the normal pixels 23 due to the light shielding pattern.

Figure 3:
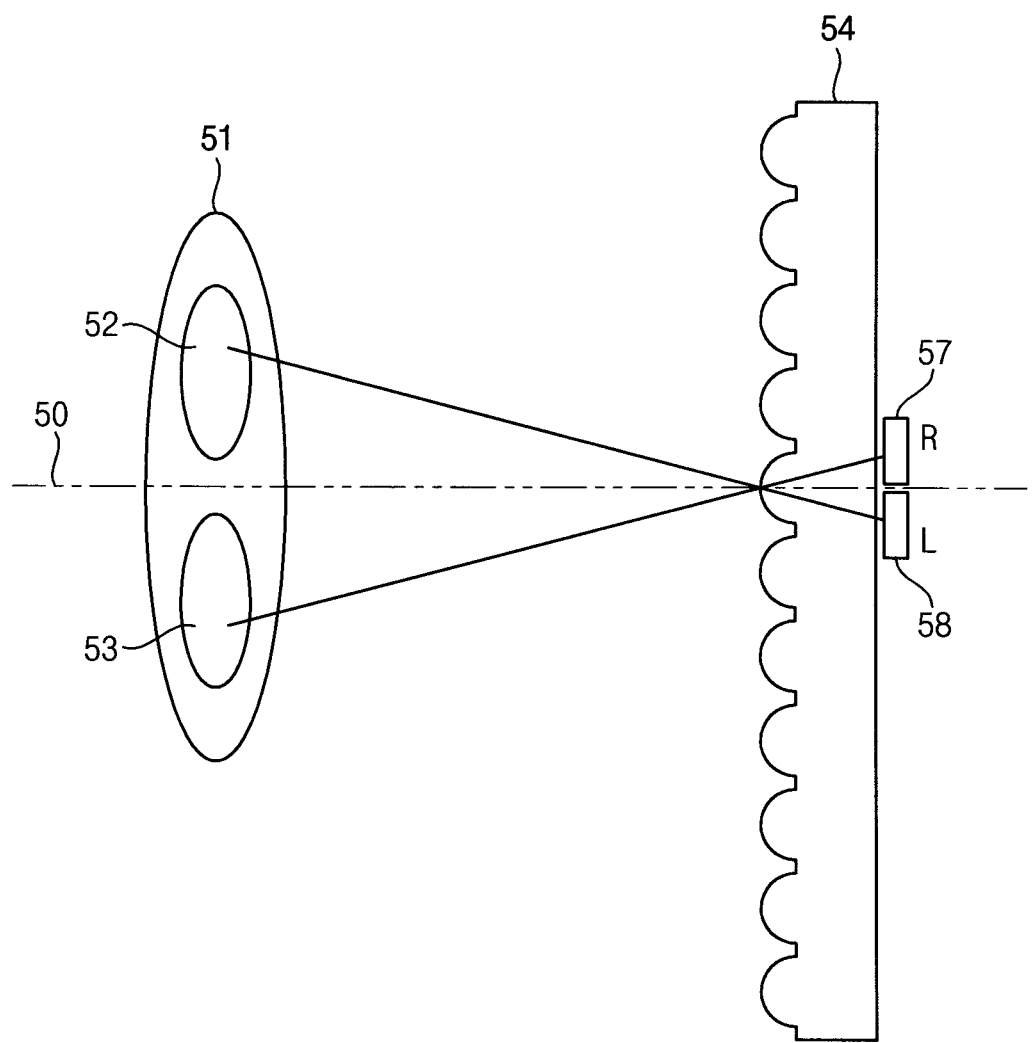
FIGS. 3, 4A and 4B are diagrams for describing an example of performing auto-focus using an auto-focus image sensor according to example embodiments.
Figure 4A:
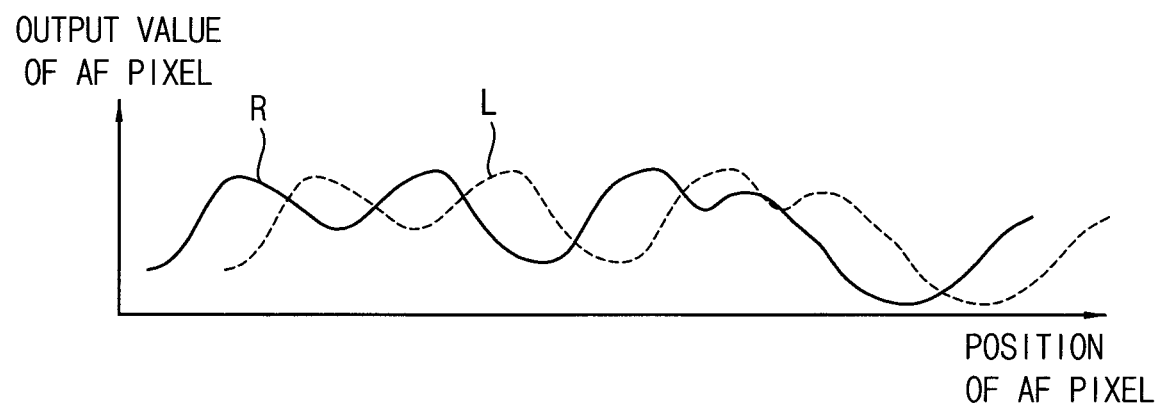
Figure 4B:
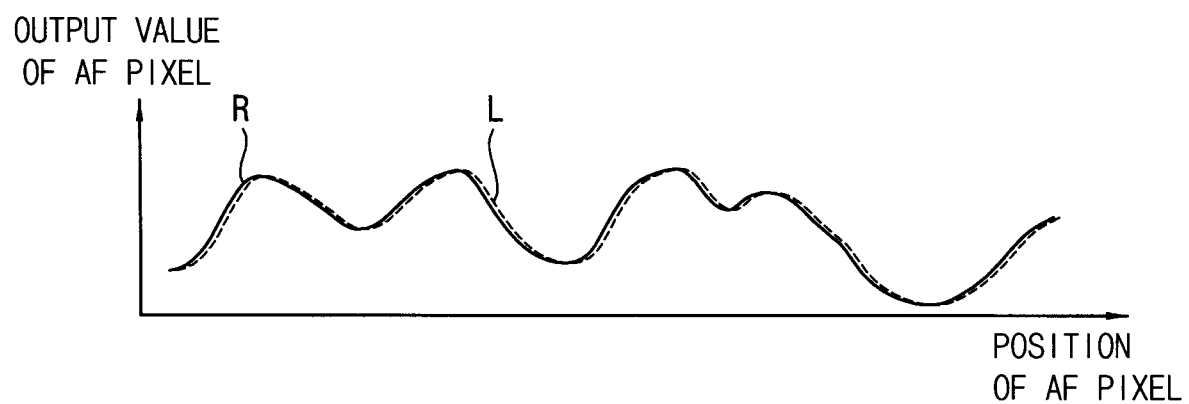

FIGS. 3, 4A and 4B are diagrams for describing an example of performing auto-focus using an auto-focus image sensor according to example embodiments.

Referring to FIGS. 3, 4A and 4B, light (or incident light) of an object that has passed through a lens 51 of an image capturing device (or an image processing device) passes through a micro lens array 54 including a plurality of micro lenses (e.g., the micro lenses 35 in FIG. 2) so as to be introduced to a first AF pixel R and a second AF pixel L. Masks or openings 57 and 58 (e.g., the first openings 31 in FIG. 2) that limit light inputted from pupils 52 and 53 of the lens 51 may be disposed adjacent to portions of the first and the second AF pixels R and L. The light inputted from the pupil 52 disposed above a light axis 50 of the lens 51 is induced to the second AF pixel L, and the light inputted from the pupil 53 disposed under the light axis 50 of the lens 51 is induced to the first AF pixel R. The term "pupil segmentation" means that the first and the second AF pixels R and L receive light, which are projected from positions of the pupils 53 and 52 by the micro lens array 54, through the masks or openings 57 and 58, respectively.

Continuous pupil-segmented pixel outputs of the first and the second AF pixels R and L according to positions of the first and the second AF pixels R and L are illustrated in FIGS. 4A and 4B. In each of FIGS. 4A and 4B, a horizontal axis represents a position of each of the first and the second AF pixels R and L, and a vertical axis represents an output value of each of the first and the second AF pixels R and L. Referring to FIGS. 4A and 4B, a shape of the continuous output value of the first AF pixel R is substantially the same as that of the second AF pixel L. However, positions (e.g., phases) of the output values of the first and the second AF pixels R and L may be different from each other as shown in FIG. 4A. This is because positions at which an image is formed based on the light provided from pupils 52 and 53 of the lens 51 are different from each other. Thus, if the lens 51 is out of focus, the phases of the output values of the first and the second AF pixels R and L are different as illustrated in FIG. 4A. If the lens 51 is in focus, the image is formed at the same position as illustrated in FIG. 4B.

In addition, a direction of a focus difference may be determined based on a difference between the phases of the output values of the first and the second AF pixels R and L. A front-focusing state means that the lens 51 focuses in front of the object. In the front-focusing state, the phase of the output value of the first AF pixel R is left-shifted from a phase of a focused state, and the phase of the output value of the second AF pixel L is right-shifted from the phase of the focused state. On the other hand, a back-focusing state means that the lens 51 focuses on a back of the object. In the back-focusing state, the phase of the output value of the first AF pixel R is right-shifted from the phase of the focused state, and the phase of the output value of the second AF pixel L is left-shifted from the phase of the focused state. The shifted amount between the phases of the output values of the first and the second AF pixels R and L may be used to obtain a deviation amount between focuses.

Figure 5:
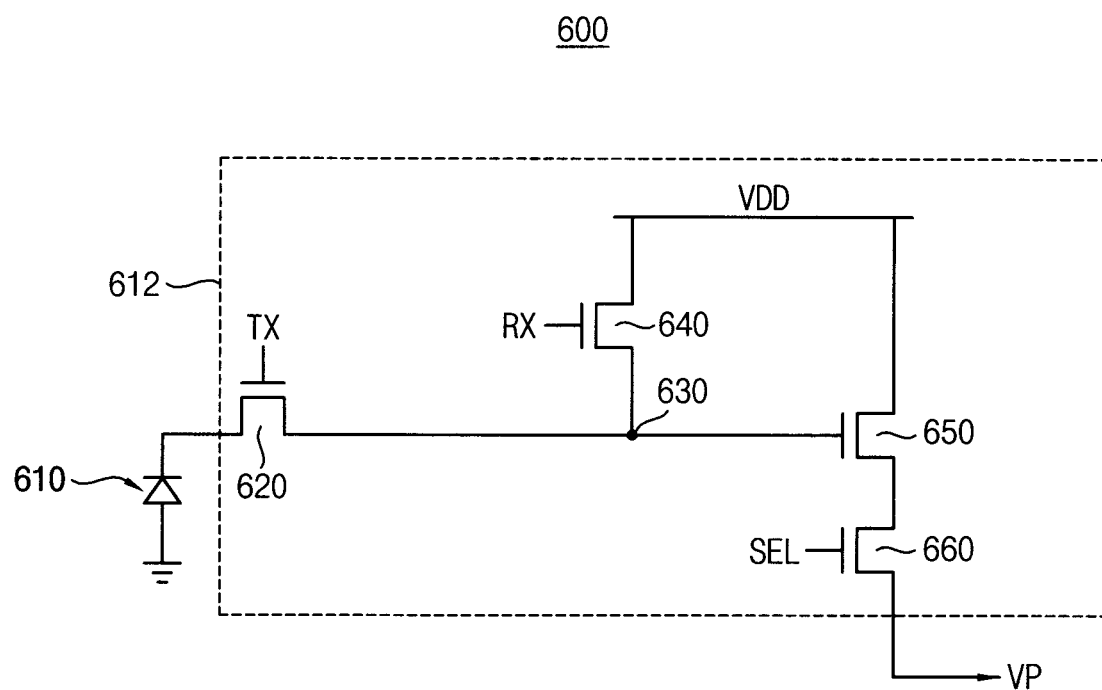
FIG. 5 is a circuit diagram illustrating an example of a pixel included in a pixel array included in an auto-focus image sensor according to example embodiments.

FIG. 5 is a circuit diagram illustrating an example of a pixel included in a pixel array included in an auto-focus image sensor according to example embodiments.

Referring to FIG. 5, a pixel or unit pixel 600 may include a photoelectric conversion part 610 and a signal generation part 612. The first pixels AFP and the second pixels NP in FIG. 1 may have the same pixel structure and circuit structure, except that the openings having different sizes are respectively formed on the first pixels AFP and the second pixels NP as described with reference to FIG. 2.

The photoelectric conversion part 610 may perform a photoelectric conversion operation. For example, the photoelectric conversion part 610 may convert the incident light into photo-charges during an integration mode. If an image sensor including the unit pixel 600 is a complementary metal oxide semiconductor (CMOS) image sensor, image information of an object to be captured may be obtained by collecting charge carriers (e.g., electron-hole pairs) in the photoelectric conversion part 610 that are proportional to intensity of the incident light through an open shutter of the CMOS image sensor during the integration mode.

The signal generation part 612 may generate an electric signal (e.g., an analog pixel signal VP) based on the photo-charges generated by the photoelectric conversion operation during a readout mode. If the image sensor including the unit pixel 600 is the CMOS image sensor, the shutter may be closed during the readout mode after the integration mode, and the analog pixel signal VP may be generated based on the image information in a form of the charge carriers. For example, as illustrated in FIG. 5, the unit pixel 600 may have four-transistor structure including four transistors.

For example, the signal generation part 612 may include a transfer transistor 620, a reset transistor 640, a driving transistor 650, a selection transistor 660 and a floating diffusion node 630. The transfer transistor 620 may be connected between the photoelectric conversion part 610 and the floating diffusion node 630, and may include a gate electrode configured to receive a transfer signal TX. The reset transistor 640 may be connected between a power supply voltage VDD and the floating diffusion node 630, and may include a gate electrode configured to receive a reset signal RX. The driving transistor 650 may be connected between the power supply voltage VDD and the selection transistor 660, and may include a gate electrode connected to the floating diffusion node 630. The selection transistor 660 may be connected between the driving transistor 650 and an output terminal configured to output the analog pixel signal VP, and may include a gate electrode configured to receive a selection signal SEL.

In some example embodiments, as will be described later with reference to FIG. 26, one signal generation part may be shared by a plurality of photoelectric conversion units.

Figure 6:
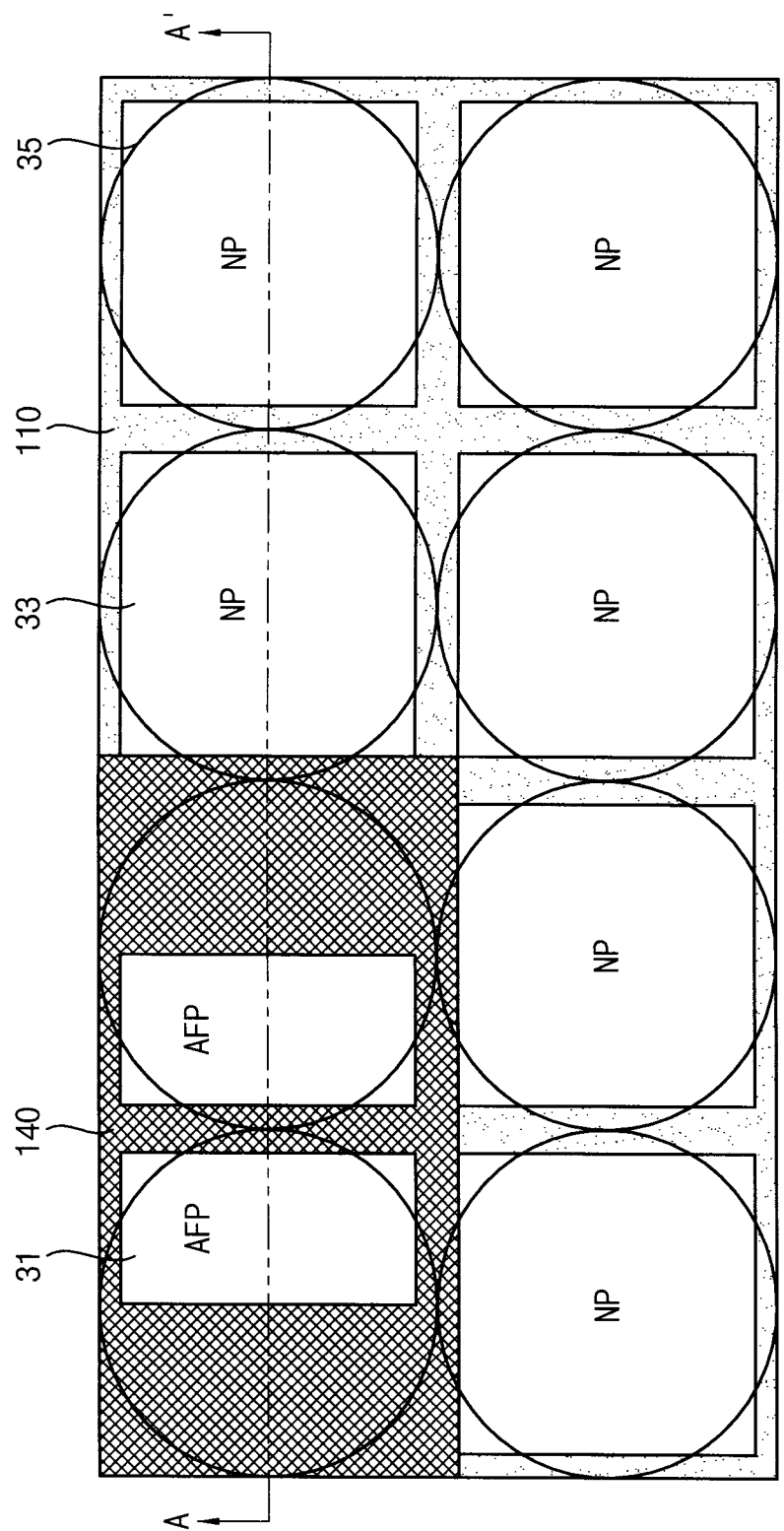
FIG. 6 is a plan view of a lower layout of a portion of the pixel array included in the auto-focus image sensor of FIG. 1.

FIG. 6 is a plan view of a lower layout of a portion of the pixel array included in the auto-focus image sensor of FIG. 1. FIG. 7 is a cross-sectional view of an example of the pixel array included in the auto-focus image sensor taken along a line A-A' of FIG. 6. For convenience of illustration, FIG. 6 illustrates a layout of an upper half of one pixel group PG included in the pixel array 100 of FIG. 1.

Figure 7:
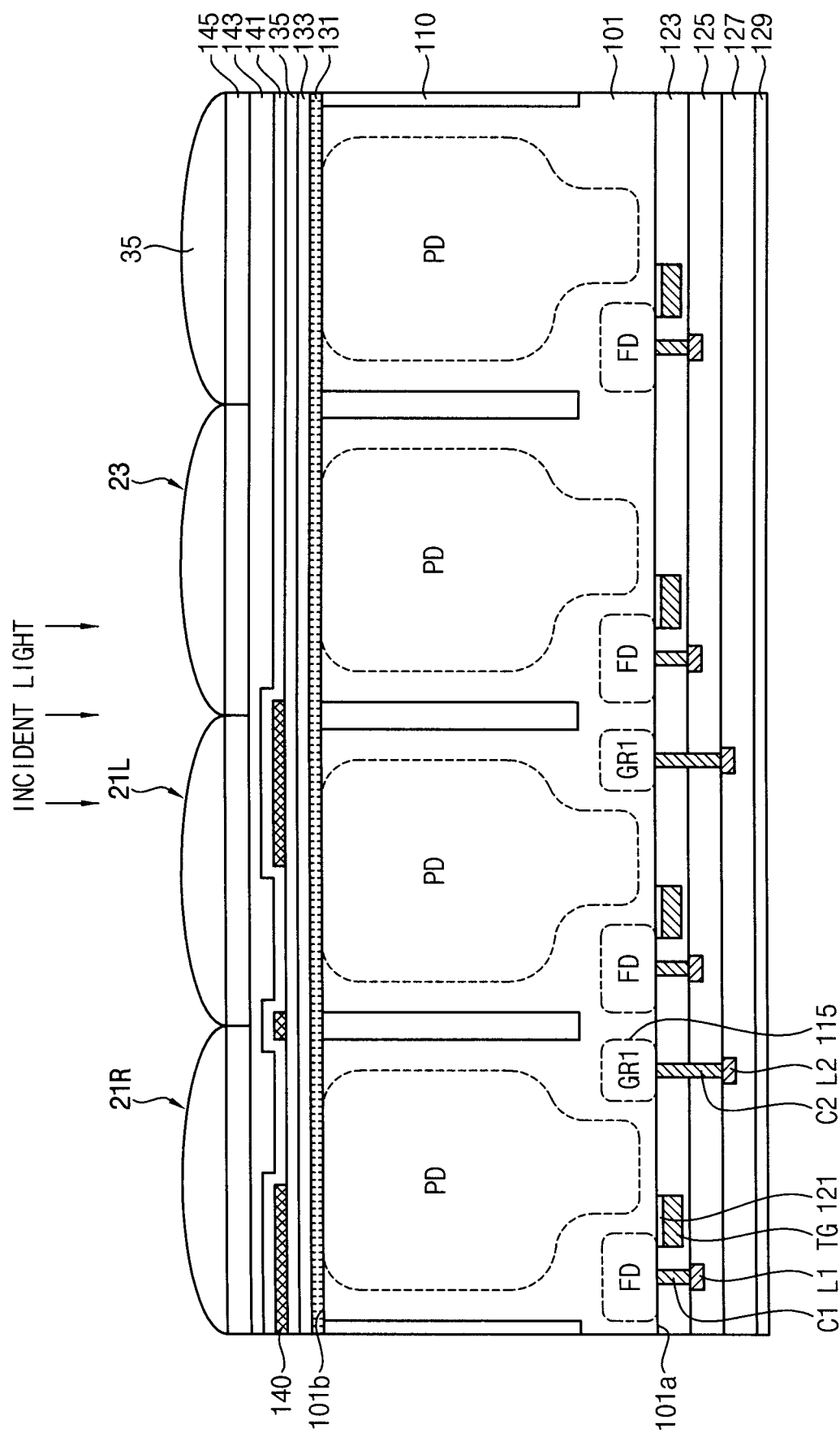
FIG. 7 is a cross-sectional view of an example of the pixel array included in the auto-focus image sensor taken along a line A-A' of FIG. 6.

Referring to FIGS. 1, 6 and 7, the pixel array 100 included in the auto-focus image sensor includes a substrate 101, a plurality of pixels AFP and NP, a deep device isolation region 110 and a plurality of first ground regions GR1 115. The pixel array 100 may further include a photoelectric conversion region PD, a floating diffusion region FD, a transfer gate TG, contacts C1 and C2, signal lines L1 and L2, a gate insulating layer 121, a first interlayer insulating layer 123, a second interlayer insulating layer 125, and a third interlayer insulating layer 127, a first passivation layer 129, a fixed charge layer 131, a first insulating layer 133, a second insulating layer 135, a light shielding pattern 140, a second passivation layer 141, a planarization layer 143, a color filter 145 and a micro lens 35.

The substrate 101 includes a first surface 101a and a second surface 101b that are opposite to each other. Gate electrodes (e.g., the transfer gate TG) and wirings (e.g., the signal lines L1 and L2) are disposed on the first surface 101a. The light shielding pattern 140, the color filter 145, the micro lens 35, etc. are disposed on the second surface 101b, and light is incident through the second surface 101b. For example, the first surface 101a may be a front surface, the second surface 101b may be a back surface, and the auto-focus image sensor including the pixel array 100 may be a backside illuminated image sensor (BIS) that operates in response to incident light passing through the back surface of the substrate 101.

In the BIS, since the gate electrodes and metal lines connected to the gate electrodes are not disposed between the micro lens 35 and the photoelectric conversion region PD, diffused reflection and/or scattering due to the gate electrodes and the metal lines may not occur, and a distance from the micro lens 35 to the photoelectric conversion region PD may be shorter. Accordingly, light guiding efficiency and light sensitivity may be improved in the BIS. In addition, positions of the signal lines L1 and L2 adjacent to the first surface 101a may not be limited. For example, the signal lines L1 and L2 may overlap with the photoelectric conversion region PD.

The plurality of pixels AFP and NP are formed or disposed in the substrate 101. The plurality of pixels AFP and NP include a plurality of first pixels AFP that are configured to detect a phase difference and a plurality of second pixels NP that are configured to detect an image. The AF pixels 21R and 21L in the focus detecting region 11 and the normal pixels 23 in the image detecting region 13 described with reference to FIG. 2 may correspond to the plurality of first pixels AFP and the plurality of second pixels NP, respectively. Each of the plurality of pixels AFP and NP may include the photoelectric conversion region PD, the floating diffusion region FD, the transfer gate TG, etc.

The photoelectric conversion region PD may correspond to the photoelectric conversion part 610 in FIG. 5. The photoelectric conversion region PD may be disposed adjacent to both the first and the second surfaces 101a and 101b in the substrate 101, and may perform photoelectric conversion based on incident light to generate photo-charges. For example, the photoelectric conversion region PD may generate electron-hole pairs in response to the incident light, and may collect the electrons and/or the holes of the electron-hole pairs. The photoelectric conversion region PD may include a photo diode, a photo transistor, a photo gate, a pinned photo diode (PPD) and/or a combination thereof.

The transfer gate TG may correspond to the transfer transistor 620 in FIG. 5. The transfer gate TG may be disposed on the first surface 101a of the substrate 101 with the gate insulating layer 121 interposed between the transfer gate TG and the first surface 101a, and may transmit the photo-charges collected by the photoelectric conversion region PD to the floating diffusion region FD. The floating diffusion region FD may correspond to the floating diffusion node 630 in FIG. 5. The floating diffusion region FD may be disposed adjacent to the first surface 101a of the substrate 101, and may accumulate the photo-charges collected by the photoelectric conversion in the photoelectric conversion region PD. AF information and/or image information may be generated based on the charge amount of the photo-charges received at the floating diffusion region FD.

The deep device isolation region 110 is formed or disposed in the substrate 101, and extends substantially vertically from the second surface 101b of the substrate 101 so as to penetrate the substrate 101 to isolate or separate the plurality of pixels AFP and NP from each other. The deep device isolation region 110 may not be in direct contact with the first surface 101a of the substrate 101. For example, the deep device isolation region 110 may have a first end and a second end while extending in a direction substantially perpendicular to the first and the second surfaces 101a and 101b of the substrate 101 in a cross-sectional view. The first end may be in direct contact with the second surface 101b to be coplanar with the second surface 101b, and the second end may not be in direct contact with the first surface 101a and not coplanar with the first surface 101a. Thus, a depth of the deep device isolation region 110 may be smaller than a thickness of the substrate 101. The deep device isolation region 110 may have a mesh structure in a plan view.

The deep device isolation region 110 may have a deep trench isolation (DTI) structure where the deep device isolation region 110 has a relatively great depth and is relatively deeply formed in the substrate 101. For example, if the auto-focus image sensor including the pixel array 100 is the BIS, the deep device isolation region 110 may have a back DTI (BDTI) structure where the deep device isolation region 110 extends from the back surface (e.g., the second surface 101b) of the substrate 101.

The plurality of first ground regions 115 are formed or disposed adjacent to the first surface 101a in the substrate 101, and are disposed adjacent to at least some of or only at least some of the plurality of first pixels AFP. For example, the plurality of first ground regions 115 may be disposed to be included in all of the plurality of first pixels AFP. All of the plurality of second pixels NP may not include the ground regions 115. Since the deep device isolation region 110 is not in direct contact with the first surface 101a, the ground voltage applied to the plurality of first ground regions 115 in the plurality of first pixels AFP may be provided to the plurality of neighboring second pixels NP via a space or gap between the deep device isolation region 110 and the first surface 101a. Thus, the plurality of second pixels NP may operate stably even if the plurality of second pixels NP do not include the ground regions.

The first surface 101a of the substrate 101 may be covered with the first interlayer insulating layer 123. The contact C1 may penetrate the first interlayer insulating layer 123. The contact C1 may contact the floating diffusion region FD. The signal line L1 may be disposed on the first interlayer insulating layer 123. The signal line L1 may contact the contact C1. The second interlayer insulating layer 125 may cover the first interlayer insulating layer 123 and the signal line L1. The contact C2 may penetrate the first and the second interlayer insulating layers 123 and 125. The contact C2 may contact the first ground region 115. The signal line L2 may be disposed on the second interlayer insulating layer 125. The signal line L2 may contact the contact C2. The third interlayer insulating layer 127 may cover the second interlayer insulating layer 125 and the signal line L2. The third interlayer insulating layer 127 may be covered with the first passivation layer 129. The signal lines L1 and L2 may correspond to interconnections.

Although not illustrated in FIG. 7, elements for forming the reset transistor 640, the driving transistor 650 and the selection transistor 660 in FIG. 5 may be further disposed on the first surface 101a of the substrate 101 and/or adjacent to the first surface 101a in the substrate 101, and contacts and signal lines connected to the elements may be further disposed between the interlayer insulating layers 123, 125 and 127.

The fixed charge layer 131 may be disposed on the second surface 101b of the substrate 101. For example, the fixed charge layer 131 may have negative fixed charges. Holes may be accumulated around the second surface 101b due to the fixed charge layer 131, and accordingly, an occurrence of a dark current and white spots may be effectively reduced. The first insulating layer 133 and the second insulating layer 135 may be sequentially stacked on the fixed charge layer 131.

The light shielding pattern 140 may be disposed on the second insulating layer (e.g., on the second surface 101b of the substrate 101). The amount of light incident on each of the plurality of first pixels AFP may be smaller than the amount of light incident on each of the plurality of second pixels NP by the light shielding pattern 140. For example, the light shielding pattern 140 may be disposed only on the focus detecting region 11. The light shielding pattern 140 may have a mesh structure overlapping the deep device isolation region 110 in a plan view. An area of the light shielding pattern 140 on each of the plurality of first pixels AFP may be greater than an area of the light shielding pattern 140 on each of the plurality of second pixels NP. The light shielding pattern 140 may include the plurality of first openings 31 at least partially exposing the plurality of first pixels AFP.

Although not illustrated in FIGS. 6 and 7, the light shielding pattern 140 may be disposed on at least a part of the image detecting region 13 to form the plurality of second openings 33 according to example embodiments.

The second passivation layer 141 may be conformally stacked on the light shielding pattern 140. The planarization layer 143 may be disposed on the second passivation layer 141. A color filter array including the color filter 145 may be disposed on the planarization layer 143, and a micro lens array including the micro lens 35 may be disposed on the color filter array. The micro lens 35 may adjust a path of light entering the micro lens 35 such that the light is focused on a corresponding photoelectric conversion region PD.

In some example embodiments, the color filter array may include a Bayer filter including red filters, green filters and/or blue filters, in other words, the color filter 145 may be one of the red, green and blue filters. In other example embodiments, the color filter array may include yellow filters, magenta filters and/or cyan filters, in other words, the color filter 145 may be one of the yellow, magenta and cyan filters. The color filter array may further include white filters.

Although not illustrated in FIG. 7, an anti-reflection layer may be formed between the planarization layer 143 and the color filter 145. The anti-reflection layer may reduce and/or prevent the incident light from being reflected by the second surface 101b of the substrate 101. In some example embodiments, the anti-reflection layer may be formed by alternately laminating materials having different refractive indices. A higher light transmittance of the anti-reflection layer may be achieved with increased lamination of such materials.

FIGS. 8A, 8B, 8C, 8D, 8E and 8F are cross-sectional views for describing a method of manufacturing the pixel array included in the auto-focus image sensor of FIGS. 6 and 7.

Figure 8A:
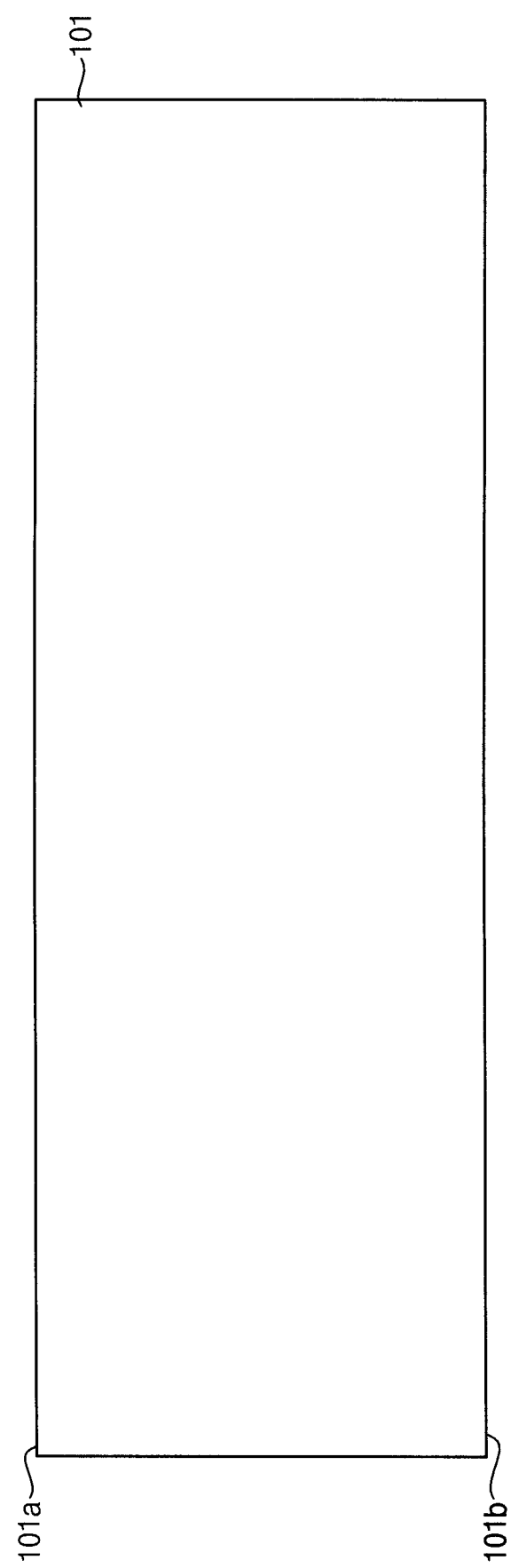
FIGS. 8A, 8B, 8C, 8D, 8E and 8F are cross-sectional views for describing a method of manufacturing the pixel array included in the auto-focus image sensor of FIGS. 6 and 7.

Referring to FIG. 8A, the substrate 101 having the first and the second surfaces 101a and 101b opposite to each other may be provided. The substrate 101 may be a semiconductor substrate. For example, the substrate 101 may be a p-type silicon substrate.

Figure 8B:
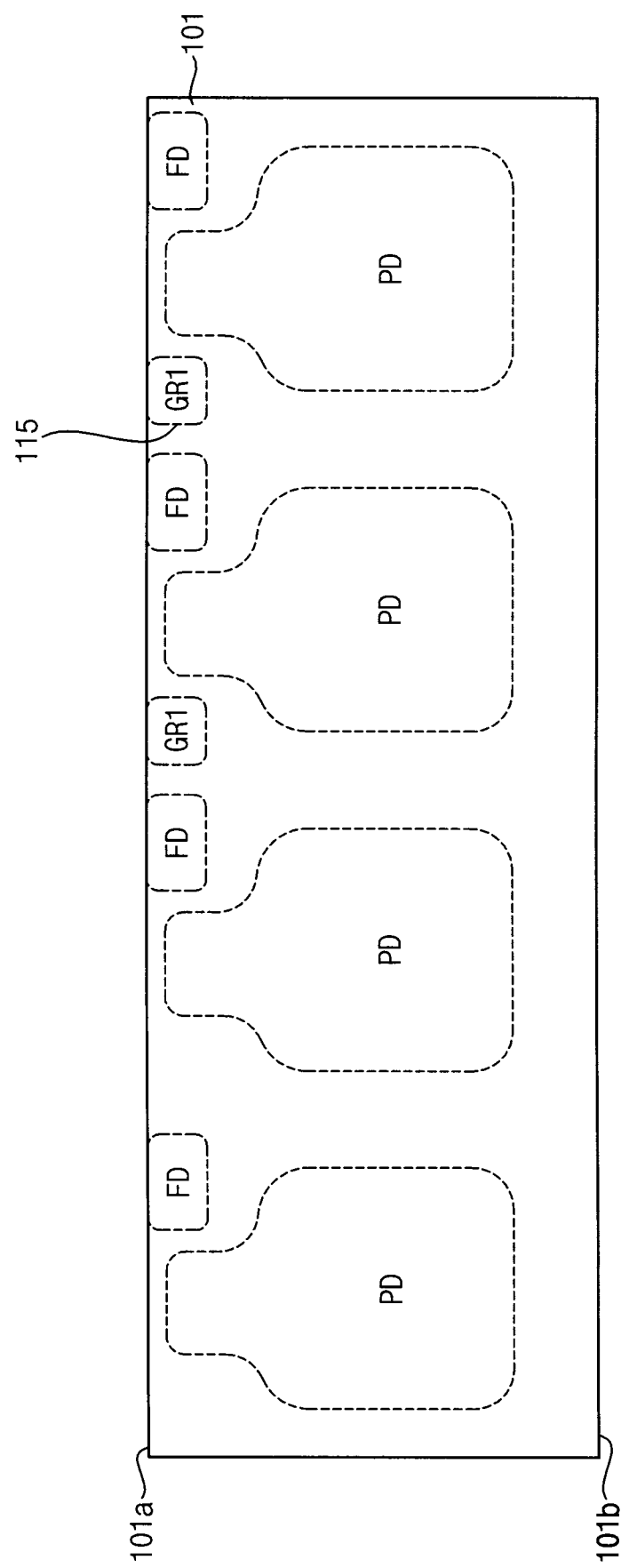

Referring to FIG. 8B, the photoelectric conversion region PD, the floating diffusion region FD and the first ground region GR1 may be formed in the substrate 101. For example, the photoelectric conversion region PD, the floating diffusion region FD and the first ground region GR1 may be formed by using, e.g., an ion implantation process. For example, the photoelectric conversion region PD and the floating diffusion region FD may be doped with n-type impurities having a type opposite to that of the substrate 101, and the first ground region GR1 may be doped with p-type impurities that is the same type as the substrate 101 with a higher concentration (or at a higher density) than the substrate 101.

The floating diffusion region FD and the first ground region GR1 may be formed adjacent to the first surface 101a. The photoelectric conversion region PD may be formed adjacent to both the first and the second surfaces 101a and 101b. Because the floating diffusion region FD and the first ground region 115 are disposed adjacent to the first surface 101a, a width (or an area) of a portion adjacent to the first surface 101a of the photoelectric conversion portion PD may be smaller than a width (or an area) of a portion adjacent to the second surface 101b of the photoelectric conversion portion PD. Since the FWC is the largest in a portion adjacent to the first surface 101a, it may be advantageous to improve the FWC characteristics by increasing a size, a width or an area of the portion of the photoelectric conversion region PD that is adjacent to the first surface 101a.

In some example embodiments, the photoelectric conversion region PD may be formed by laminating two or more doped regions. In some example embodiments, the floating diffusion region FD may be doped with a higher concentration than the photoelectric conversion region PD.

Figure 8C:
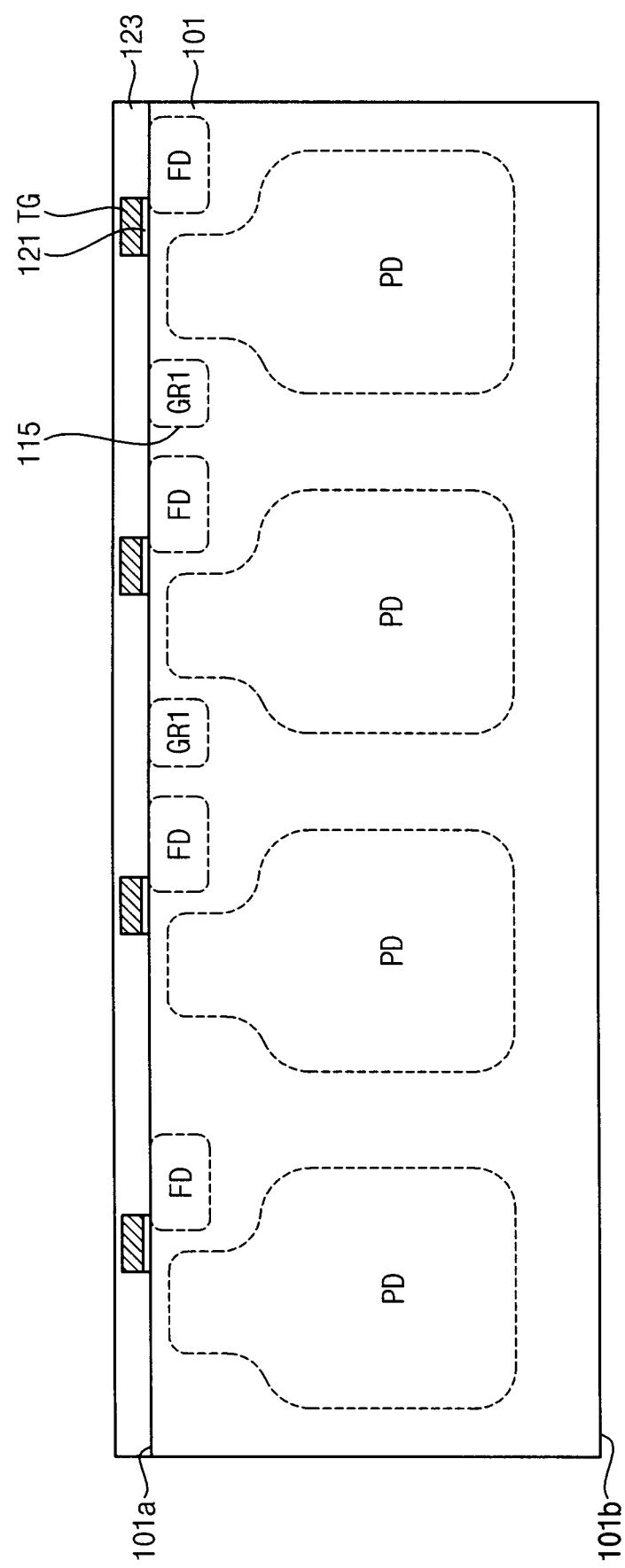
Figure 8D:
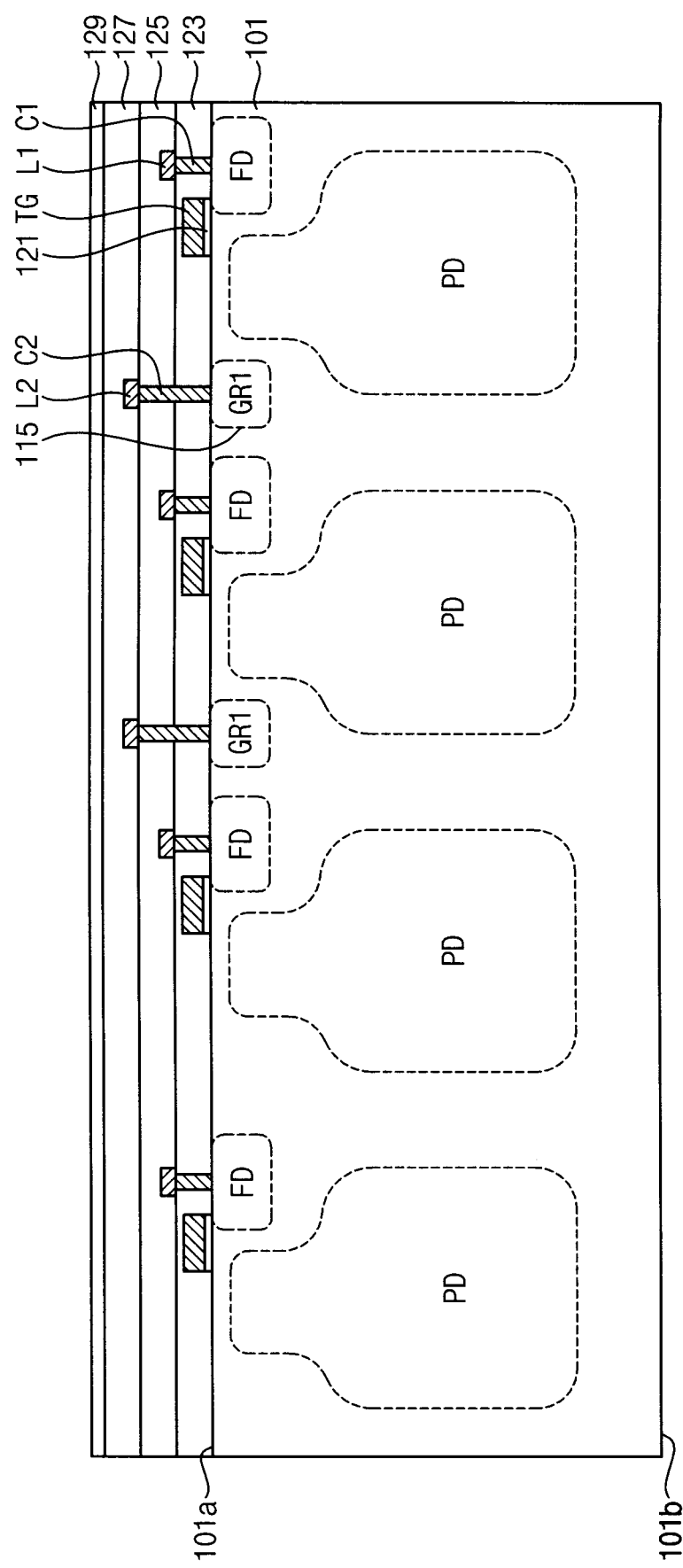

Referring to FIG. 8C, the gate insulating layer 121 and the transfer gate TG may be formed on the first surface 101a, and the first interlayer insulating layer 123 may be formed to cover the first surface 101a. Referring to FIG. 8D, the contact C1 may be formed to penetrate the first interlayer insulating layer 123, the signal line L1 may be formed on the first interlayer insulating layer 123, and the second interlayer insulating layer 125 may be formed on the first interlayer insulating layer 123. In addition, the contact C2 may be formed to penetrate the first and the second interlayer insulating layers 123 and 125, the signal line L2 may be formed on the second interlayer insulating layer 125, and the third interlayer insulating layer 127 and the first passivation layer 129 may be sequentially formed on the second interlayer insulating layer 125.

For example, the transfer gate TG may be formed by forming a gate conductive layer of a polysilicon, metal and/or a metal compound, and by patterning the gate conductive layer. For example, the contacts C1 and C2 and the signal lines L1 and L2 may be formed by forming a conductive layer of copper, tungsten, titanium and/or aluminum, and by patterning the conductive layer. For example, the interlayer insulating layers 123, 125 and 127 may be formed of, for example, silicon oxide (SiOx), silicon oxynitride (SiOxNy), silicon nitride (SiNx), germanium oxynitride (GeOxNy), germanium silicon oxide (GeSixOy), and/or a material having a high dielectric constant (e.g. hafnium oxide (HfOx), zirconium oxide (ZrOx), aluminum oxide (AlOx), tantalum oxide (TaOx), hafnium silicate (HfSix), and/or zirconium silicate (ZrSix)).

Figure 8E:
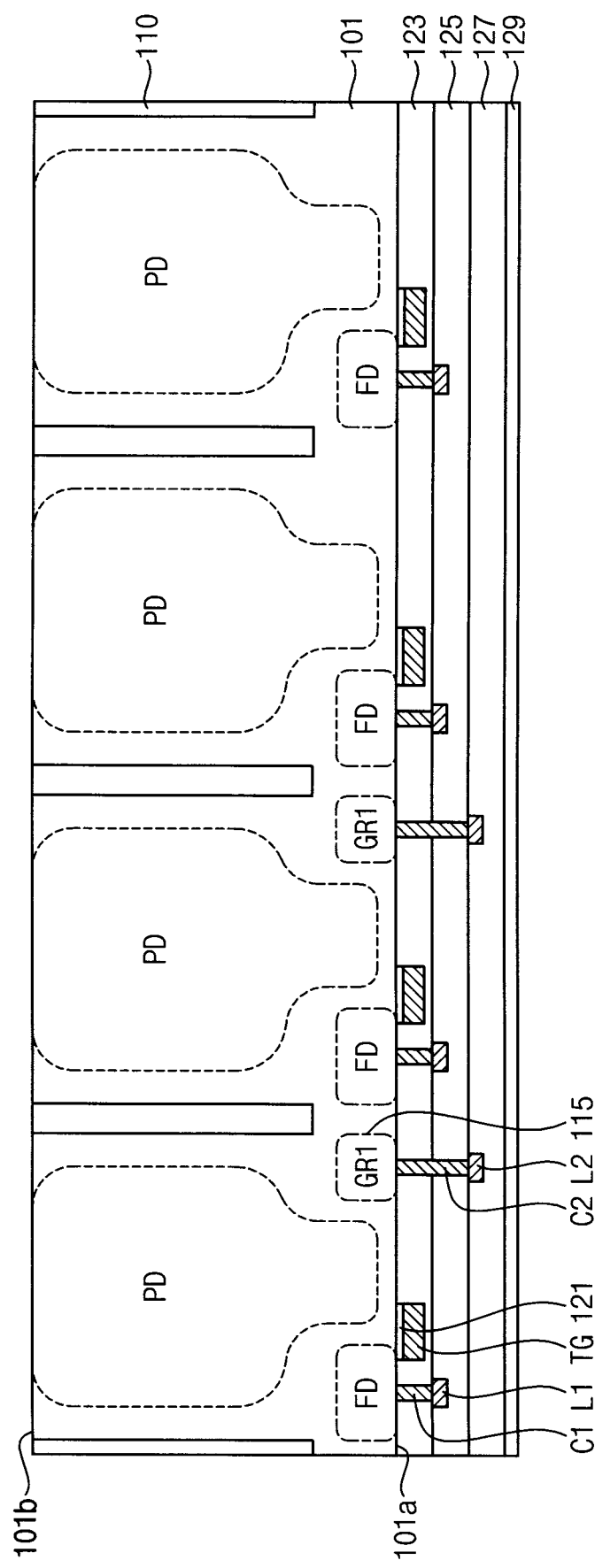

Referring to FIG. 8E, the substrate 101 may be turned over such that the second surface 101b faces upward, and a back grinding process may be performed on the second surface 101b so that a portion, which is adjacent to the second surface 101b, of the substrate 101 is removed. For example, the grinding process may be performed by a mechanical process and/or a chemical process. For example, the mechanical process may be performed by rubbing a polishing pad on the second surface 101b. In addition, the chemical process may be performed by injecting chemical materials, e.g., a "slurry", between a polishing pad and the second surface 101b.

In addition, after the substrate 101 is turned over and the portion of the substrate 101 is removed as illustrated in FIG. 8E, the deep device isolation region 110 may be formed in the substrate 101. For example, the deep device isolation region 110 may be formed of insulating material such as silicon oxide. For example, the deep device isolation region 110 may be formed such that the insulating material is vertically formed in the substrate 101 from the second surface 101b. Thus, one end of the deep device isolation region 110 may be in direct contact with the second surface 101b, and the other end of the deep device isolation region 110 may not be in direct contact with the first surface 101a.

In some example embodiments, the deep device isolation region 110 may be filled with a dielectric material that has a refractive index lower than a refractive index of the substrate 101. In this example, although some of the incident light is refracted by the micro lens 35, a leakage component of the incident light may be totally reflected at a sidewall surface of the deep device isolation region 110. A reflection component may reach the photoelectric conversion region PD, and thus neighboring pixels may be shielded from the leakage component. In addition, since the deep device isolation region 110 may be filled with the dielectric material, the diffusion carriers generated by the incident light may be sufficiently prevented from being transferred to the neighboring pixels from the photoelectric conversion region PD.

In some example embodiments, the deep device isolation region 110 may be formed by repeatedly implanting the dielectric material in the substrate 101 with different energies. Although not illustrated in FIG. 8E, as the dielectric material is repeatedly implanted with different energies, the deep device isolation region 110 may have an embossed shape.

Figure 8F:
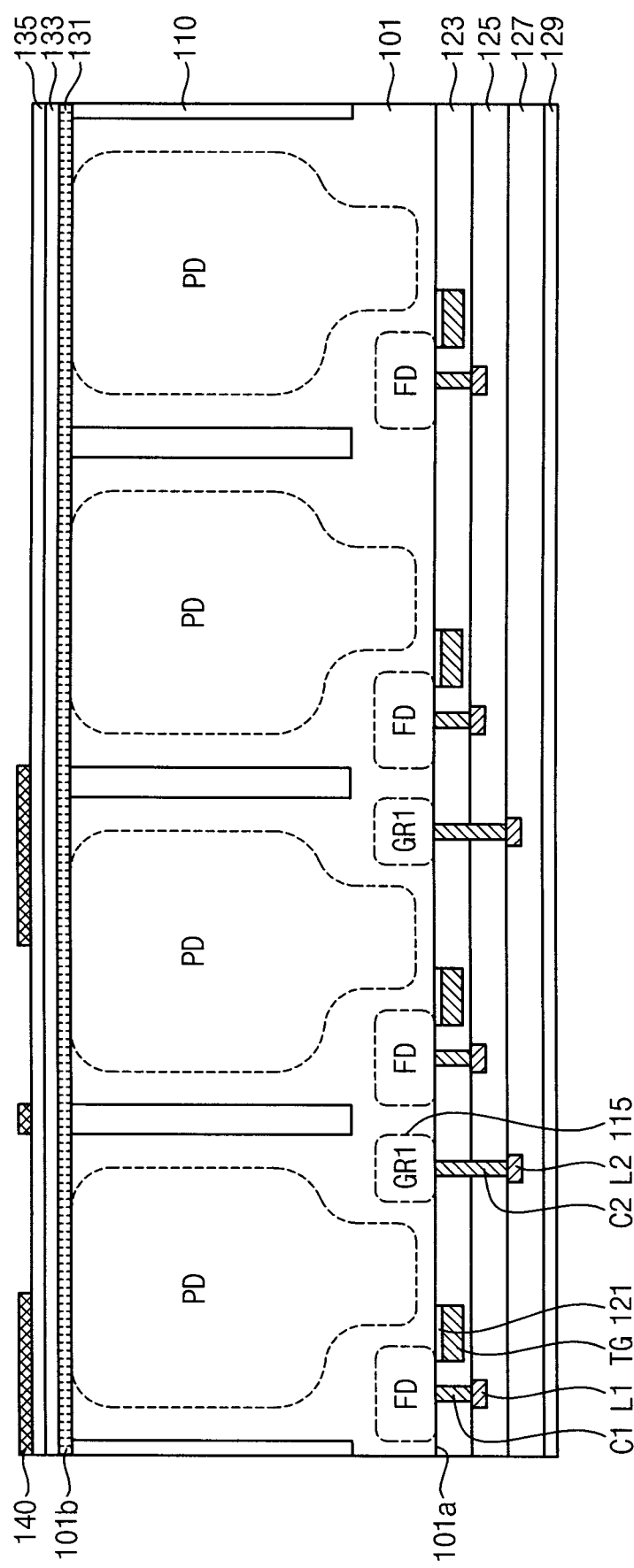

Referring to FIG. 8F, the fixed charge layer 131, the first and the second insulating layers 133 and 135 and the light shielding pattern 140 may be sequentially formed on the second surface 101b. For example, the fixed charge layer 131 may be formed of metal oxide including a metal element, e.g., zirconium (Zr), aluminum (Al), tantalum (Ta), titanium (Ti), Yttrium (Y) and/or lanthanoids. The fixed charge layer 131 may have at least one crystallized region. For example, the fixed charge layer 131 may be a hafnium oxide layer or an aluminum fluoride layer. For example, the first insulating layer 133 may be a silicon oxide layer, and the second insulating layer 135 may be a silicon nitride layer. For example, the light shielding pattern 140 may be formed of an opaque metal.

In the BIS, noise may occur due to surface defects that exist, e.g., surface defects caused by a manufacturing process, in a region adjacent to the second surface 101b of the substrate 101. If the fixed charge layer 131 is formed on the second surface 101b, the holes may be accumulated in the region adjacent to the second surface 101b of the substrate 101. Electric charges generated by the surface defects without any incident light may be coupled with the holes accumulated in the region adjacent to the second surface 101b of the substrate 101. Thus, the dark current may be reduced, and the light guiding efficiency and light sensitivity may be improved.

Next, as described with reference to FIG. 7, the second passivation layer 141, the planarization layer 143, the color filter 145 and the micro lens 35 may be sequentially formed on the light shielding pattern 140. For example, the color filter 145 may be formed by using a dye process, a pigment dispersing process and/or a printing process. For example, the micro lens 35 may be formed by forming patterns corresponding to the photoelectric conversion region PD with photoresists having light-penetrability and by reflowing the patterns to have convex shapes.

FIGS. 9, 10, 11, 12, 13, 14 and 15 are cross-sectional views of other examples of the pixel array included in the auto-focus image sensor taken along a line A-A' of FIG. 6. The descriptions that are repetitive with FIGS. 6 and 7 will be omitted.

Referring to FIG. 9, an example of FIG. 9 may be substantially the same as the example of FIG. 7, except that a deep device isolation region 110a includes an insulating layer 111 and a polysilicon pattern 113 in FIG. 9.

The insulating layer 111 may surround the polysilicon pattern 113. The polysilicon pattern 113 may be formed or disposed in the deep device isolation region 110a, e.g., inside the insulating layer 111. For example, the polysilicon pattern 113 may be formed of polysilicon, metal and/or a metal compound. Since the polysilicon pattern 113 has a substantially same thermal expansion coefficient as the substrate 101 formed of silicon, it may be possible to reduce a physical stress caused by a difference between thermal expansion coefficients of materials. In some example embodiments, the polysilicon pattern 113 may be formed before or after the insulating layer 111 is formed.

Figure 10:
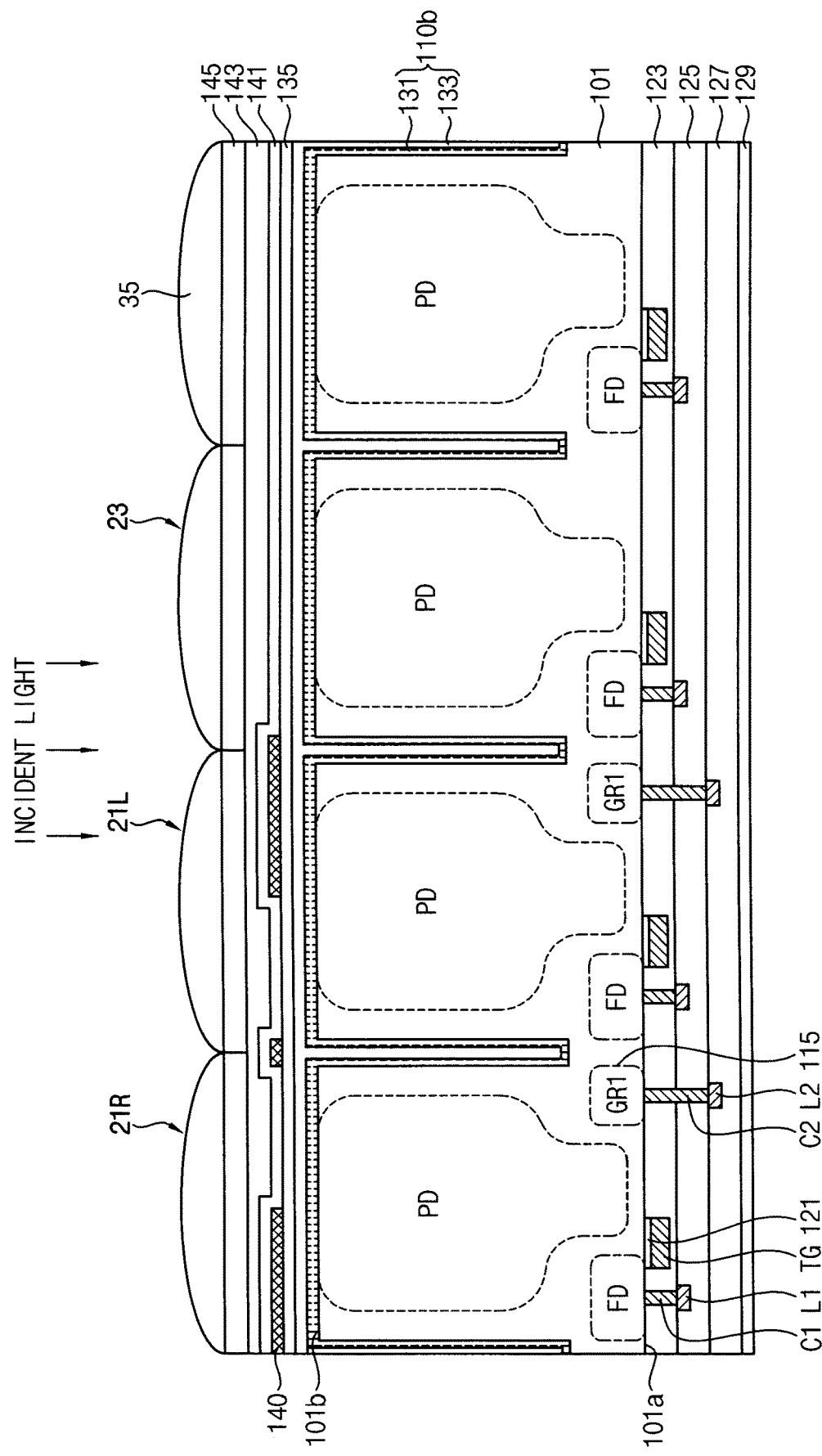

Referring to FIG. 10, an example of FIG. 10 may be substantially the same as the example of FIG. 7, except that a deep device isolation region 110b includes the fixed charge layer 131 and the first insulating layer 133 in FIG. 10. For example, the fixed charge layer 131 may include a hafnium oxide layer. For example, the first insulating layer 133 may include a silicon oxide layer or a silicon nitride layer. The fixed charge layer 131 may be disposed on the second surface 101b and may surround sidewalls of the photoelectric conversion region PD, thereby further reducing the dark current.

Figure 11:
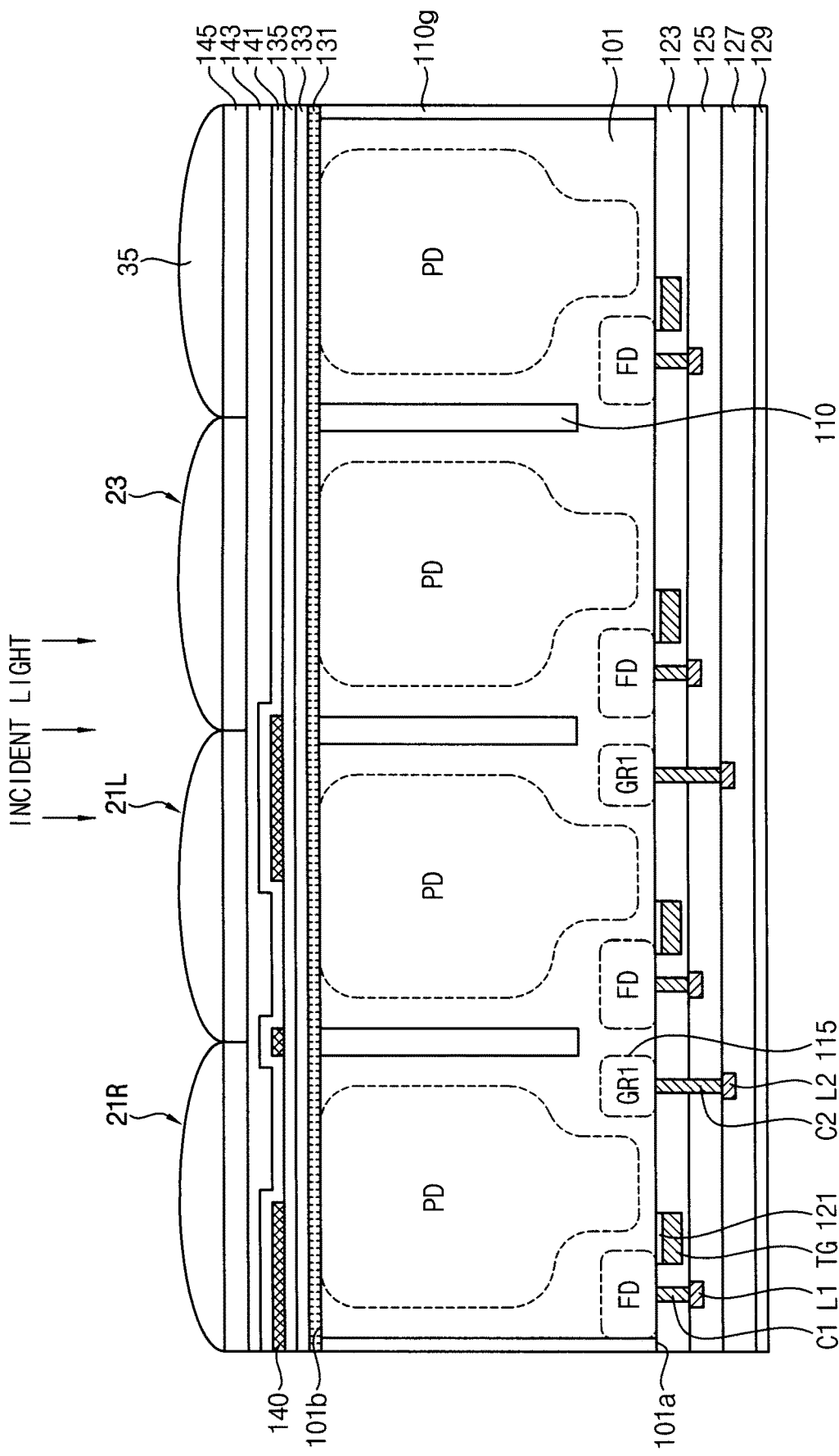

Referring to FIG. 11, an example of FIG. 11 may be substantially the same as the example of FIG. 7, except that a portion of the deep device isolation region is changed in FIG. 11. For example, a portion of the deep device isolation region 110g may extend from the second surface 101b of the substrate 101 and may be in direct contact with the first surface 101a of the substrate 101.

In some example embodiments, as described with reference to FIG. 1, the plurality of pixels may be divided into the plurality of pixel groups PG each of which includes at least one of the plurality of first pixels AFP and at least one of the plurality of second pixels NP, and a portion of the deep device isolation region 110g may extend from the second surface 101b of the substrate 101 and may be in direct contact with the first surface 101a of the substrate 101 such that the plurality of pixel groups PG are isolated from each other. In this example, the plurality of first ground regions GR1 may be disposed in the substrate 101 such that each of the plurality of pixel groups PG includes at least one of the plurality of first ground regions GR1. When the portion of the deep device isolation region 110g is in direct contact with the first surface 101a of the substrate 101, the ground voltage applied to the plurality of first ground regions 115 may not be provided to neighboring pixels in some cases. Thus, when the plurality of pixel groups PG are isolated or separated from each other by the portion of the deep device isolation region 110g, each of the plurality of pixel groups PG may include at least one of the plurality of first ground regions GR1 for stable operation.

Figure 12:
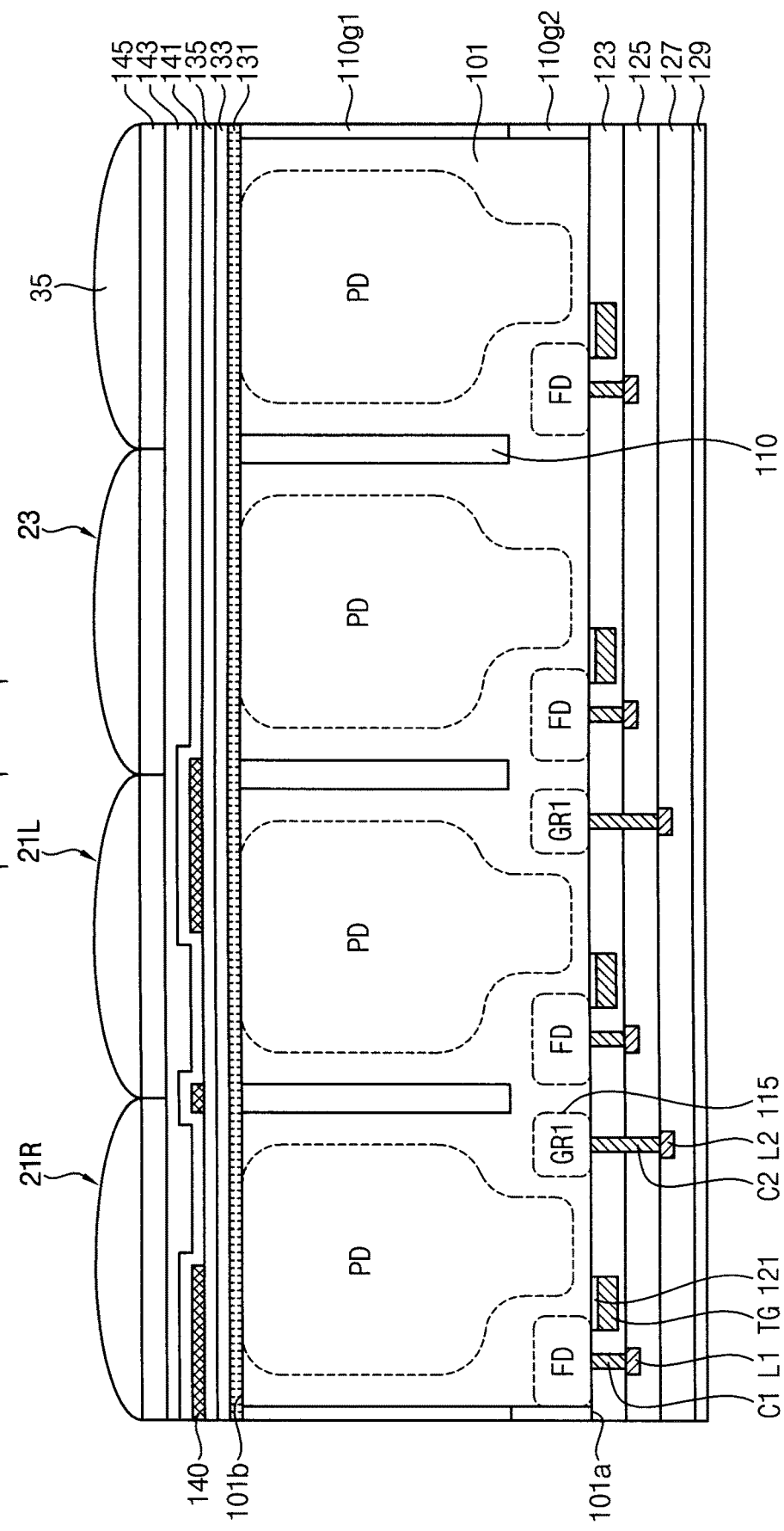

Referring to FIG. 12, an example of FIG. 12 may be substantially the same as the example of FIG. 7, except that the deep device isolation region includes a first sub deep device isolation region 110g1 and a second sub deep device isolation region 110g2 in FIG. 12. The first sub deep device isolation region 110g1 may be substantially the same as the deep device isolation region 110 in FIG. 7. The second sub deep device isolation region 110g2 may be substantially the same as the portion of the deep device isolation region 110g that is in direct contact with the first surface 101a of the substrate 101 in FIG. 11. For example, the first sub deep device isolation region 110g1 may be formed such that an insulating material is vertically formed in the substrate 101 from the second surface 101b, and the second sub deep device isolation region 110g2 may be formed such that an insulating material is vertically formed in the substrate 101 from the first surface 101a.

Figure 13:
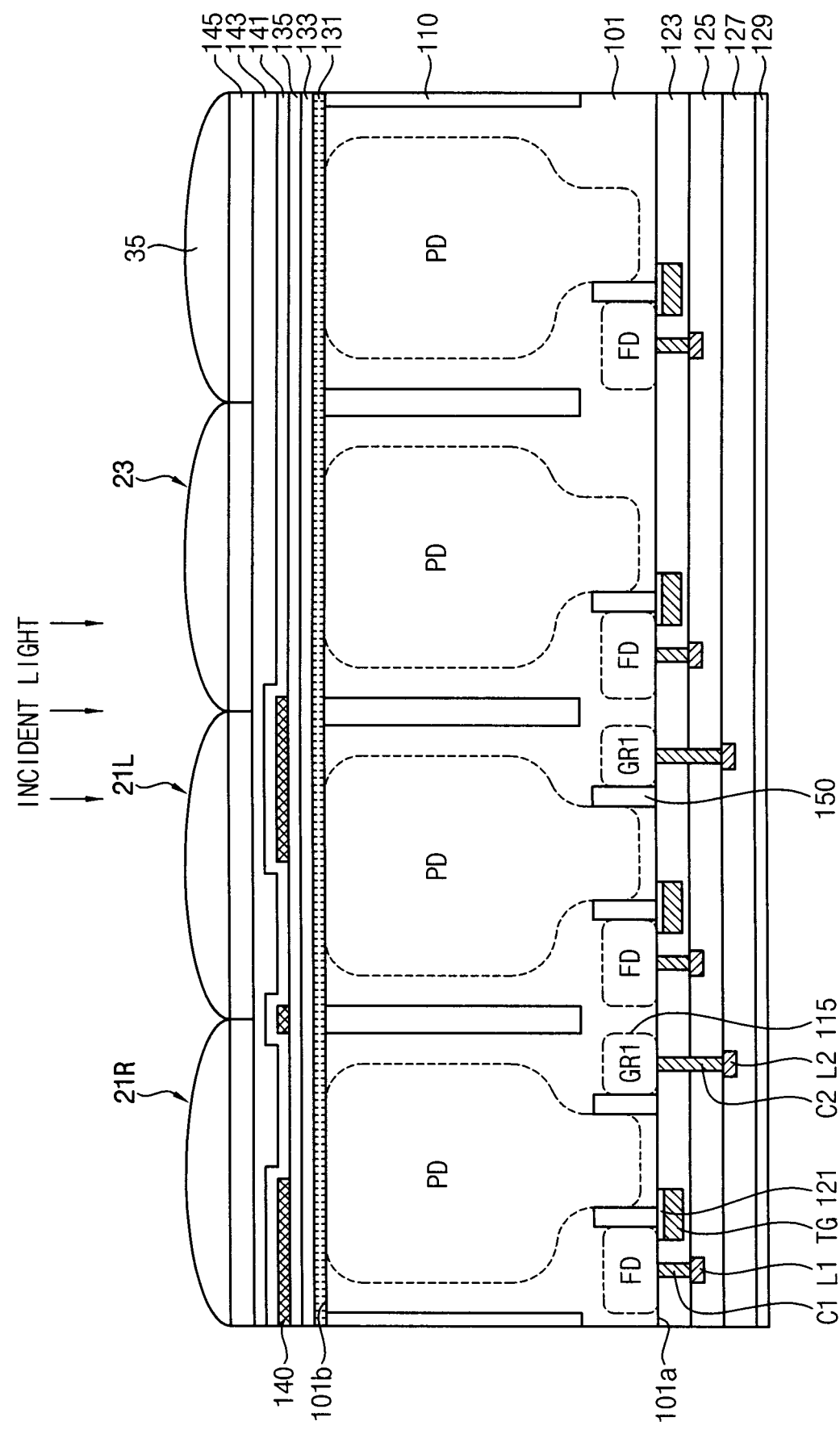

Referring to FIG. 13, an example of FIG. 13 may be substantially the same as the example of FIG. 7, except that the example of FIG. 13 further includes a shallow device isolation region 150. The shallow device isolation region 150 may have a shallow trench isolation (STI) structure where the shallow device isolation region 150 has a relatively small depth and is relatively shallowly formed in the substrate 101. The shallow device isolation region 150 may isolate the photoelectric conversion region PD, the floating diffusion region FD, and the first ground region GR1 from each other. For example, a shallow trench may be formed by etching the substrate 101, and the shallow trench may be filled with a filling insulating layer to form the shallow device isolation region 150.

Figure 14:
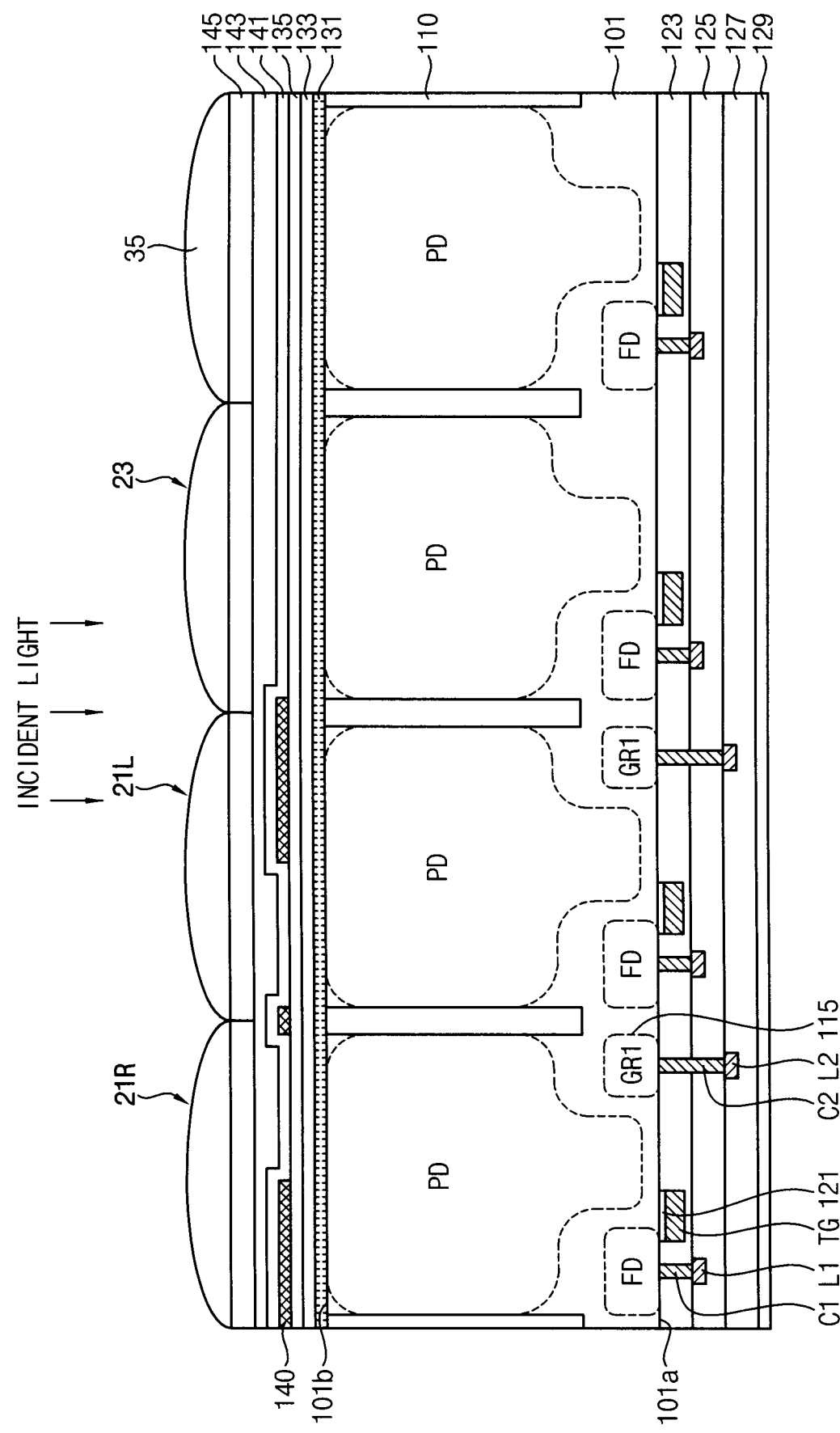

Referring to FIG. 14, an example of FIG. 14 may be substantially the same as the example of FIG. 7, except that a structure of the photoelectric conversion region PD is changed in FIG. 14. Unlike the example of FIG. 7 in which a side surface of the photoelectric conversion region PD is spaced apart from the deep device isolation region 110, at least a portion or an entirety of the side surface of the photoelectric conversion region PD may be formed to be in contact with the deep device isolation region 110 in an example of FIG. 14, and thus a size of the photoelectric conversion region PD may increase.

Figure 15:
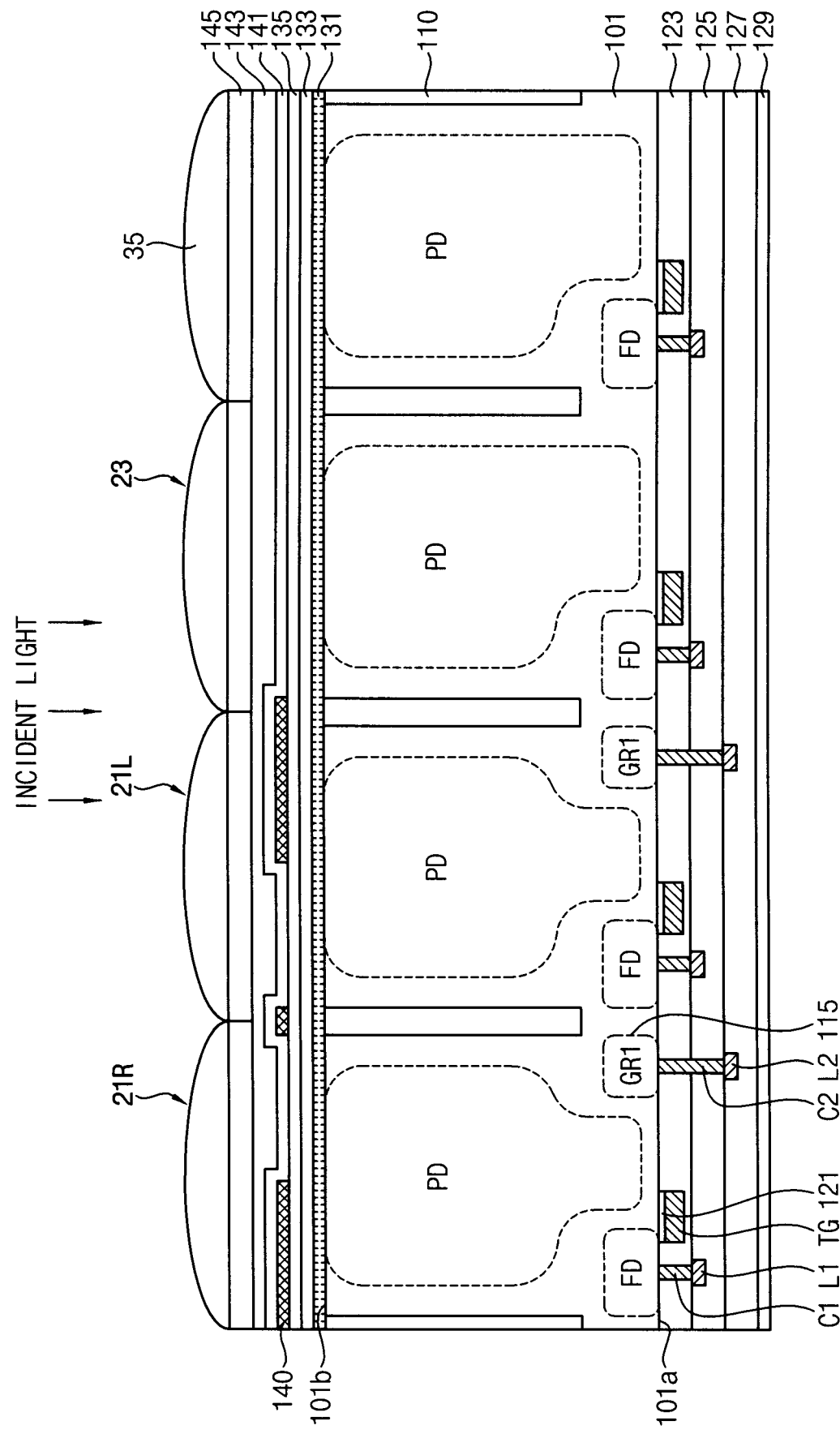

Referring to FIG. 15, an example of FIG. 15 may be substantially the same as the example of FIG. 7, except that a structure of the photoelectric conversion region PD is partially changed in FIG. 15. In an example of FIG. 15, a size of the photoelectric conversion region PD included in the plurality of second pixels NP (e.g., the normal pixels 23) may be larger than a size of the photoelectric conversion region PD included in the plurality of first pixels AFP (e.g., the AF pixels 21R and 21L). As described above, the plurality of second pixels NP may not include the ground regions, and thus the size of the photoelectric conversion region PD included in the plurality of second pixels NP may increase by a portion where the ground regions are not formed.

In some example embodiments, two or more of the examples described with reference to FIGS. 7, 9, 10, 11, 12, 13, 14 and 15 may be combined to implement the pixel array included in the auto-focus image sensor according to example embodiments.

Figure 16:
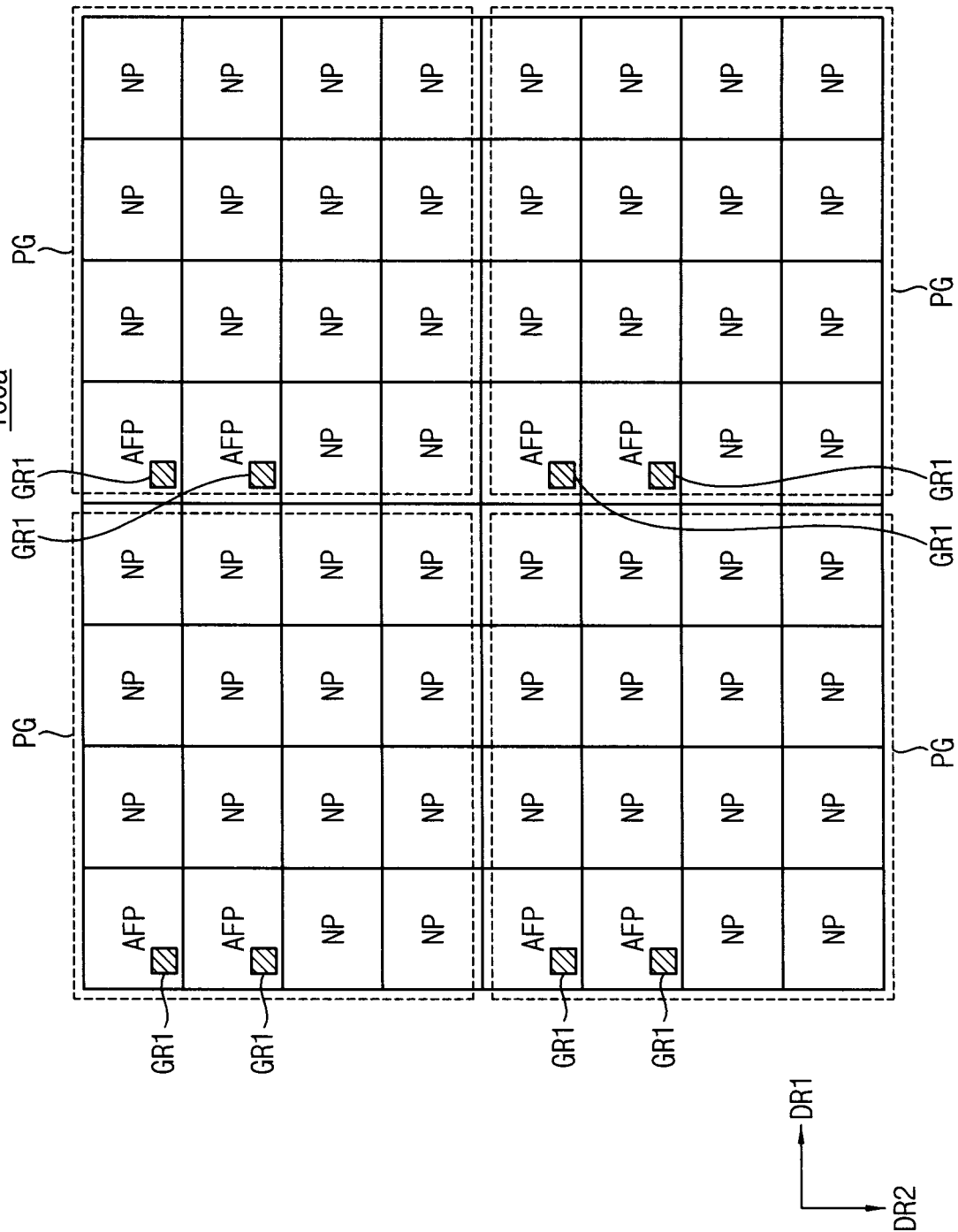
FIG. 16 is a plan view of a pixel array included in an auto-focus image sensor according to example embodiments.
Figure 17:
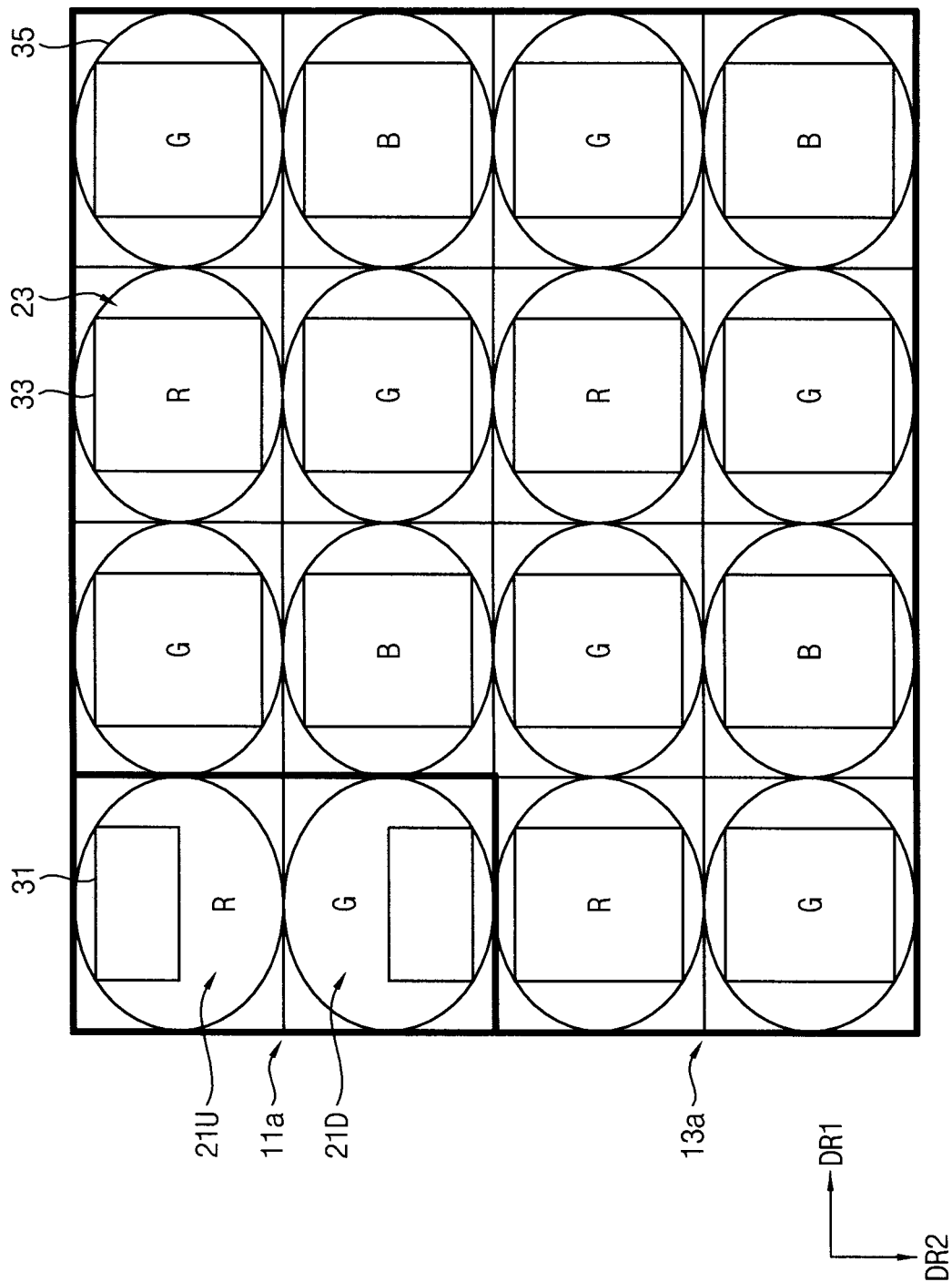
FIG. 17 is a plan view of a layout of a portion of the pixel array included in the auto-focus image sensor of FIG. 16.

FIG. 16 is a plan view of a pixel array included in an auto-focus image sensor according to example embodiments. FIG. 17 is a plan view of a layout of a portion of the pixel array included in the auto-focus image sensor of FIG. 16. The descriptions that are repetitive with FIGS. 1 and 2 will be omitted.

Referring to FIGS. 16 and 17, examples of FIGS. 16 and 17 may be substantially the same as the example of FIGS. 1 and 2, except that an arrangement and a structure of the plurality of first pixels AFP are changed in FIGS. 16 and 17.

A pixel array 100a included in an auto-focus image sensor may include a focus detecting region 11a and an image detecting region 13a. The focus detecting region 11a may include a third AF pixel 21U and a fourth AF pixel 21D that are adjacent to each other and are used to detect a phase difference. The image detecting region 13a may include normal pixels 23 that are used to detect an image.

A light shielding pattern that controls the light-receiving amounts of at least the AF pixels 21U and 21D may be disposed. The light shielding pattern may include a plurality of first openings 31 formed on the AF pixels 21U and 21D. The first openings 31 of the third and the fourth AF pixels 21U and 21D adjacent to each other may be disposed to be vertically symmetric. The first openings 31 of the light shielding pattern may reduce the amount of light incident on each of the AF pixels 21U and 21D in comparison with the amount of light incident on each of the normal pixels 23.

In some example embodiments, the pixel array included in the auto-focus image sensor according to example embodiments may be implemented to include both the AF pixels 21R and 21L described with reference to FIG. 2 and the AF pixels 21U and 21D described with reference to FIG. 17.

Figure 18:
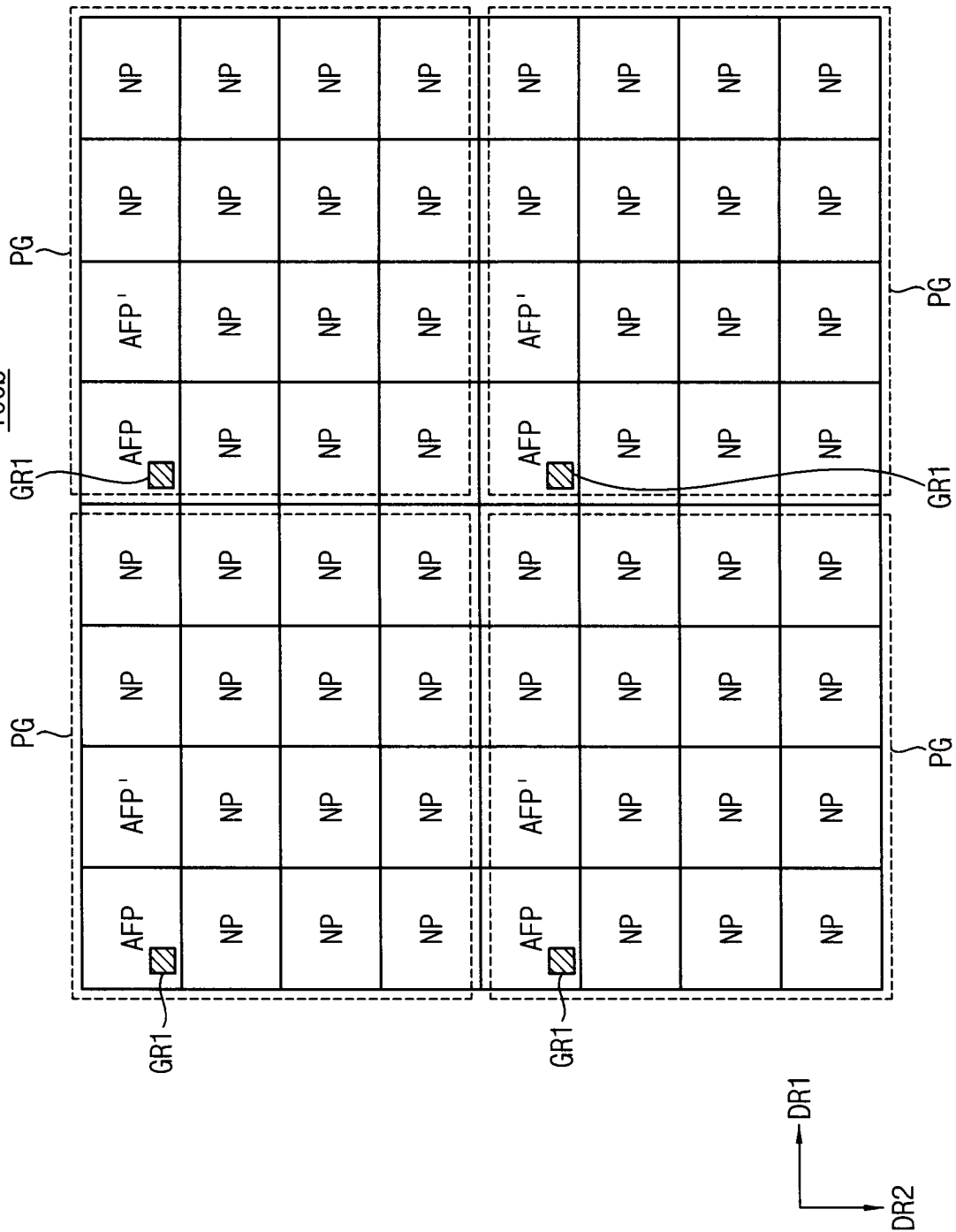
FIG. 18 is a plan view of a pixel array included in an auto-focus image sensor according to example embodiments.
Figure 19:
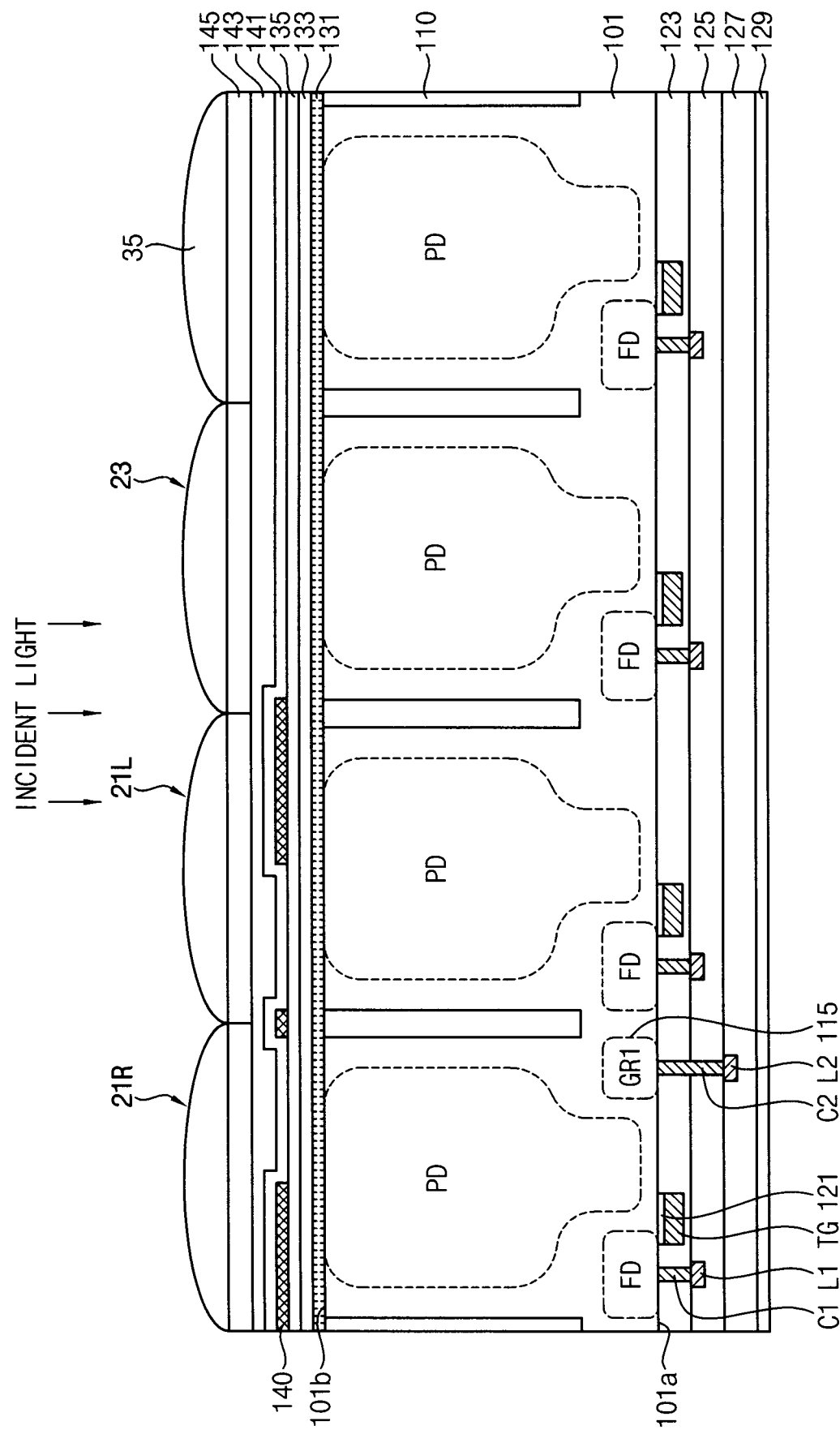
FIG. 19 is a cross-sectional view of an example of the pixel array included in the auto-focus image sensor of FIG. 18.

FIG. 18 is a plan view of a pixel array included in an auto-focus image sensor according to example embodiments. FIG. 19 is a cross-sectional view of an example of the pixel array included in the auto-focus image sensor of FIG. 18. The descriptions that are repetitive with FIGS. 1, 6 and 7 will be omitted.

Referring to FIGS. 18 and 19, examples of FIGS. 18 and 19 may be substantially the same as the examples of FIGS. 1, 6 and 7, except for first pixels AFP and AFP' in FIGS. 18 and 19.

In a pixel array 100b included in an auto-focus image sensor, the number of the plurality of first ground regions GR1 may be less than the number of the plurality of first pixels AFP and AFP', and the plurality of first ground regions GR1 may be disposed adjacent to some first pixels AFP among the plurality of first pixels AFP and AFP'. In other words, some first pixels AFP among the plurality of first pixels AFP and AFP' may include respective ones of the plurality of first ground regions GR1, and the remaining first pixels AFP' among the plurality of first pixels AFP and AFP' may not include the plurality of first ground regions GR1. The first pixels not including the first ground region GR1 are designated as AFP'. Similar to that described with reference to FIG. 1, the plurality of first ground regions GR1 may be arranged uniformly and regularly throughout the pixel array 100b.

Figure 20:
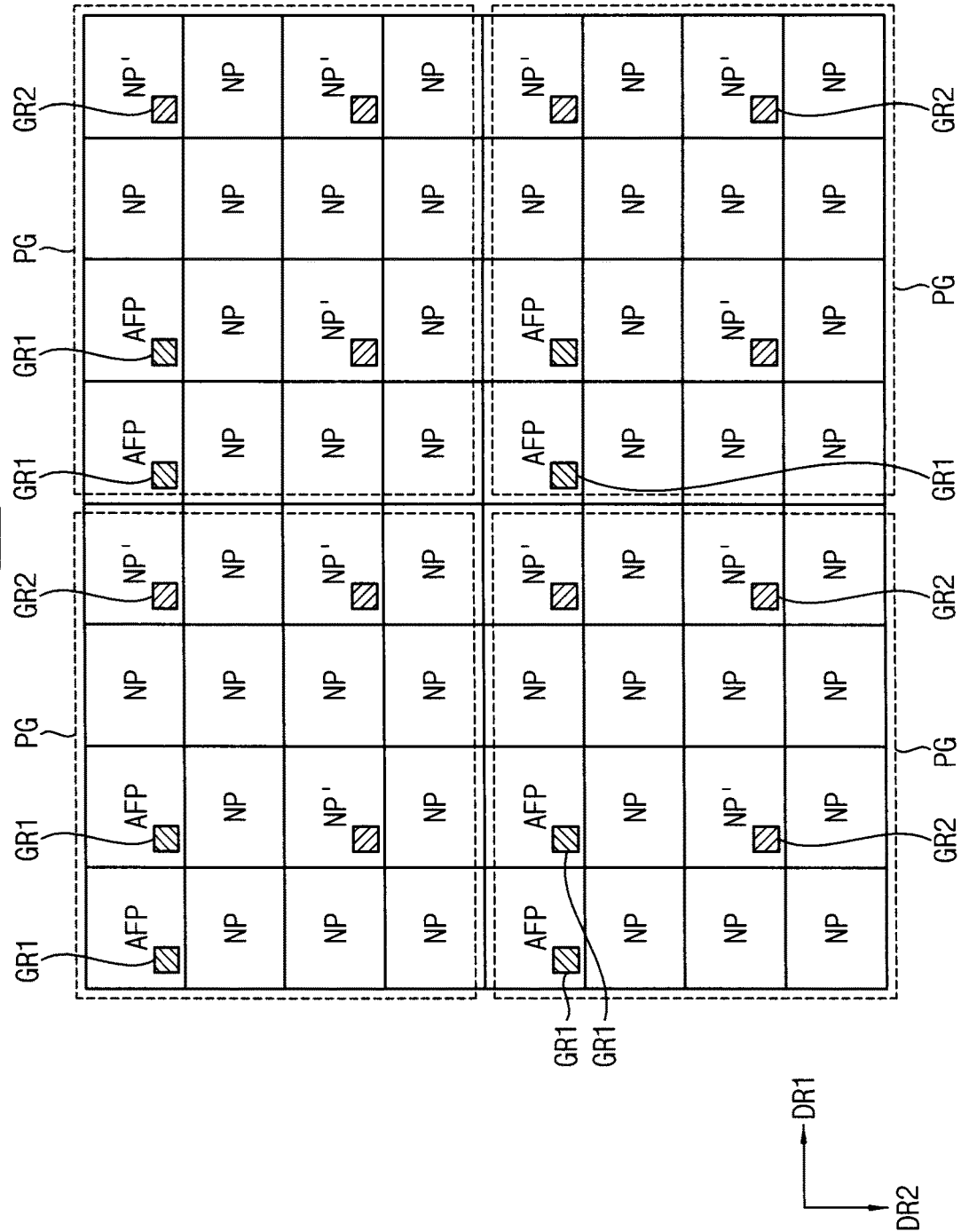
FIG. 20 is a plan view of a pixel array included in an auto-focus image sensor according to example embodiments.
Figure 21:
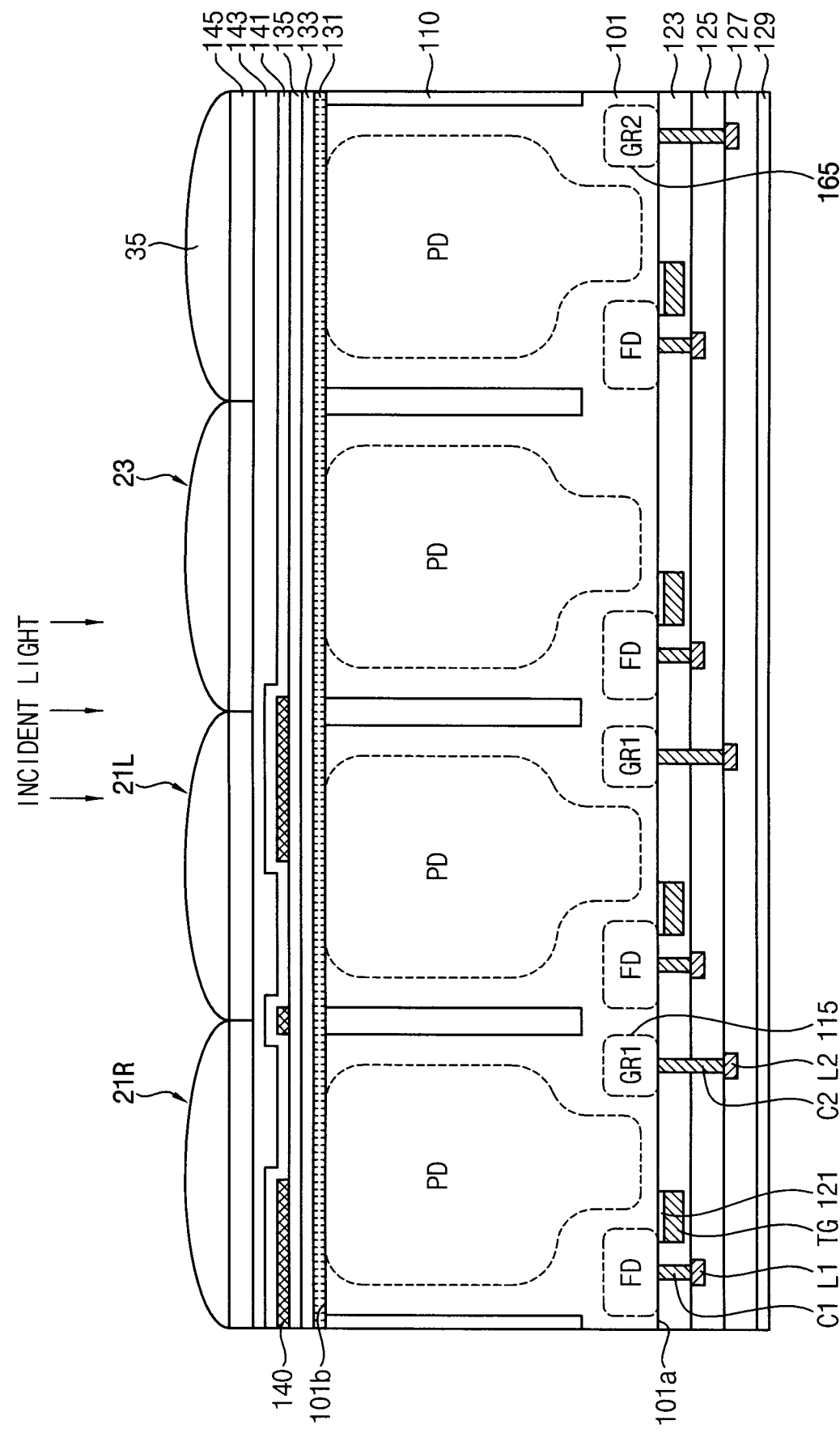
FIGS. 21 and 22 are cross-sectional views of examples of the pixel array included in the auto-focus image sensor of FIG. 20.
Figure 22:
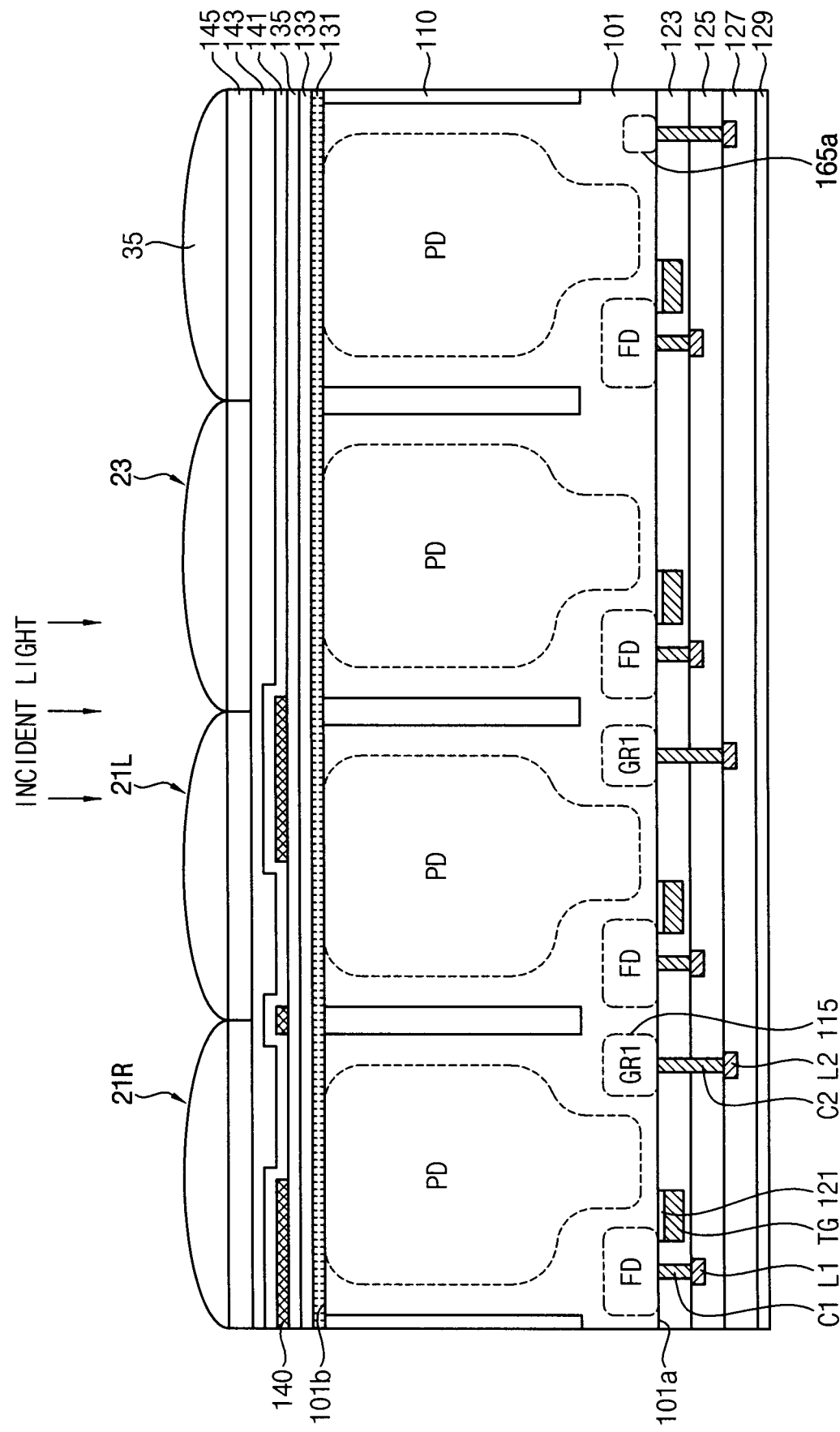

FIG. 20 is a plan view of a pixel array included in an auto-focus image sensor according to example embodiments. FIGS. 21 and 22 are cross-sectional views of examples of the pixel array included in the auto-focus image sensor of FIG. 20. The descriptions that are repetitive with FIGS. 1, 6 and 7 will be omitted.

Referring to FIGS. 20, 21 and 22, examples of FIGS. 20, 21 and 22 may be substantially the same as the examples of FIGS. 1, 6 and 7, except that a configuration of at least some of a plurality of second pixels are changed in FIGS. 20, 21 and 22.

A pixel array 100c included in an auto-focus image sensor may further include a plurality of second ground regions GR2. The plurality of second ground regions GR2 may be formed or disposed adjacent to the first surface 101a in the substrate 101, and may be disposed adjacent to only some second pixels NP' among the plurality of second pixels NP and NP'. In other words, some second pixels NP' among the plurality of second pixels NP and NP' may include respective ones of the plurality of second ground regions GR2. The second pixels including the second ground region GR2 are designated as NP'. As with the plurality of first ground regions GR1, the ground voltage may be applied to the plurality of second ground region GR2 to reduce the dark current. The plurality of first and second ground regions GR1 and GR2 may be arranged uniformly and regularly throughout the pixel array 100c.

In some example embodiments, as illustrated in FIG. 21, a size (or an area) of a second ground region 165 may be substantially the same as a size (or an area) of the first ground region 115. In other example embodiments, as illustrated in FIG. 22, a size (or an area) of a second ground region 165a may be smaller than the size (or an area) of the first ground region 115. As described with reference to FIG. 7, the ground voltage may be provided to the neighboring pixels via the space between the deep device isolation region 110 and the first surface 101a, and thus the plurality of second pixels NP and NP' may operate stably even if the second ground region 165a has a relatively small size.

Figure 23:
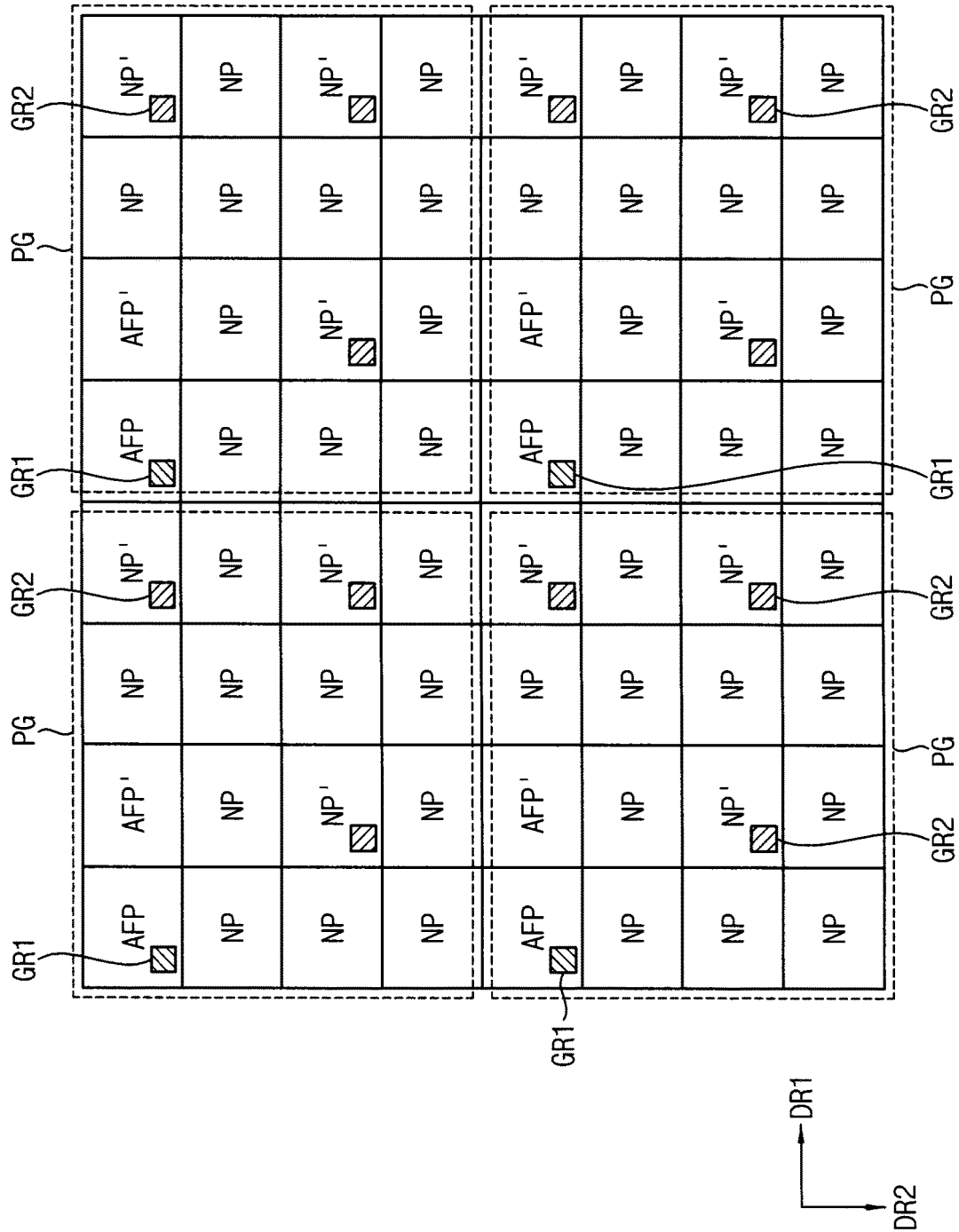
FIG. 23 is a plan view of a pixel array included in an auto-focus image sensor according to example embodiments.
Figure 24:
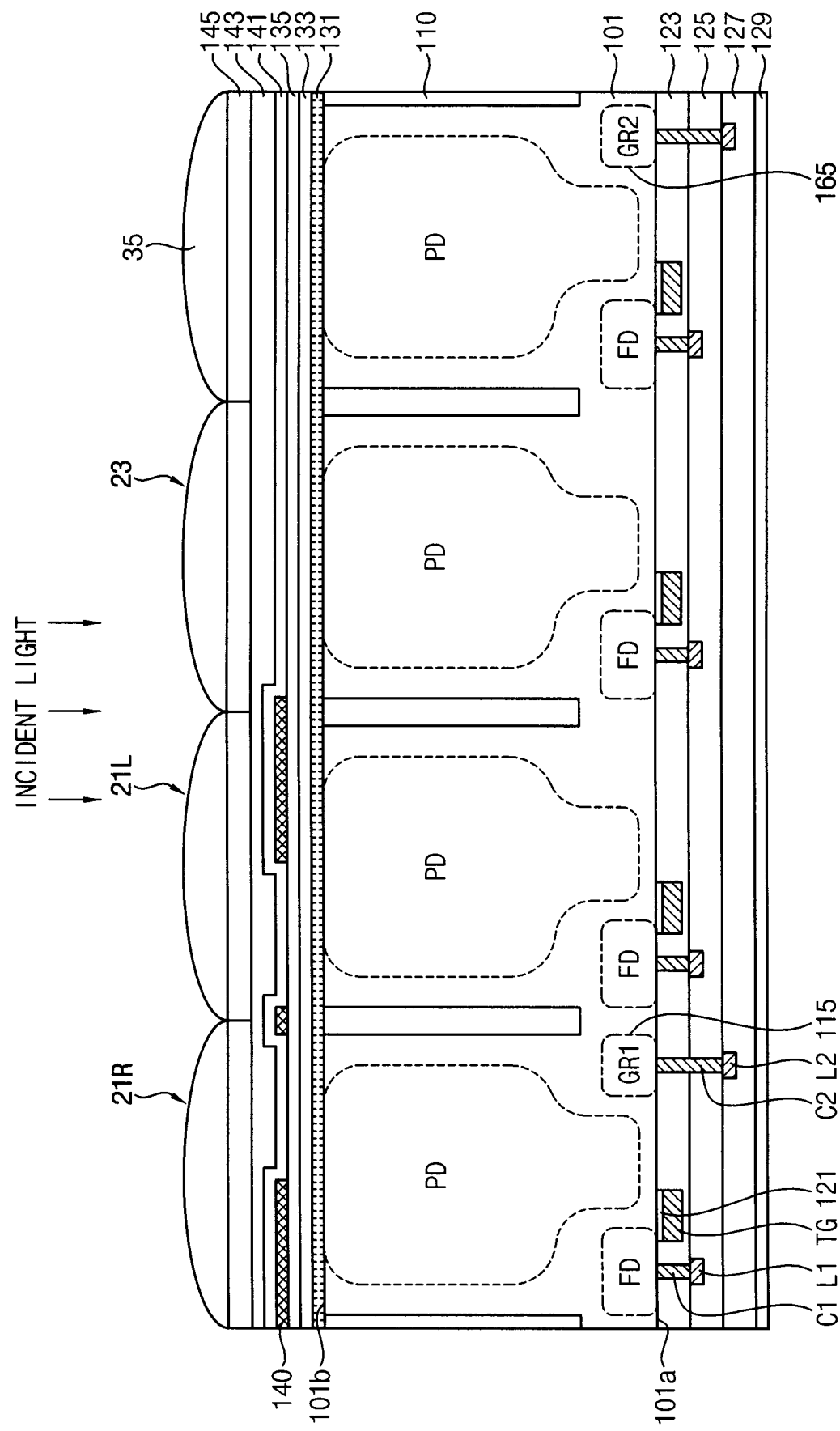
FIG. 24 is a cross-sectional view of an example of the pixel array included in the auto-focus image sensor of FIG. 23.

FIG. 23 is a plan view of a pixel array included in an auto-focus image sensor according to example embodiments. FIG. 24 is a cross-sectional view of an example of the pixel array included in the auto-focus image sensor of FIG. 23. The descriptions that are repetitive with FIGS. 1, 6 and 7 will be omitted.

Referring to FIGS. 23 and 24, examples of FIGS. 23 and 24 may be substantially the same as the example of FIGS. 1, 6 and 7, except for the first pixels AFP' among the plurality of first pixels AFP and AFP' and the second pixels NP' among the plurality of second pixels NP and NP' in FIGS. 23 and 24. In a pixel array 100d included in an auto-focus image sensor, the first pixels AFP' may be substantially the same as described with reference to FIGS. 18 and 19, and the second pixels NP' may be substantially the same as described with reference to FIGS. 20, 21 and 22

In some example embodiments, the pixel arrays illustrated in FIGS. 19, 21, 22 and 24 may be changed or modified based on the examples as described with reference to FIGS. 7, 9, 10, 11, 12, 13, 14 and 15, or may be implemented in combination of two or more of the above-described examples.

Figure 25:
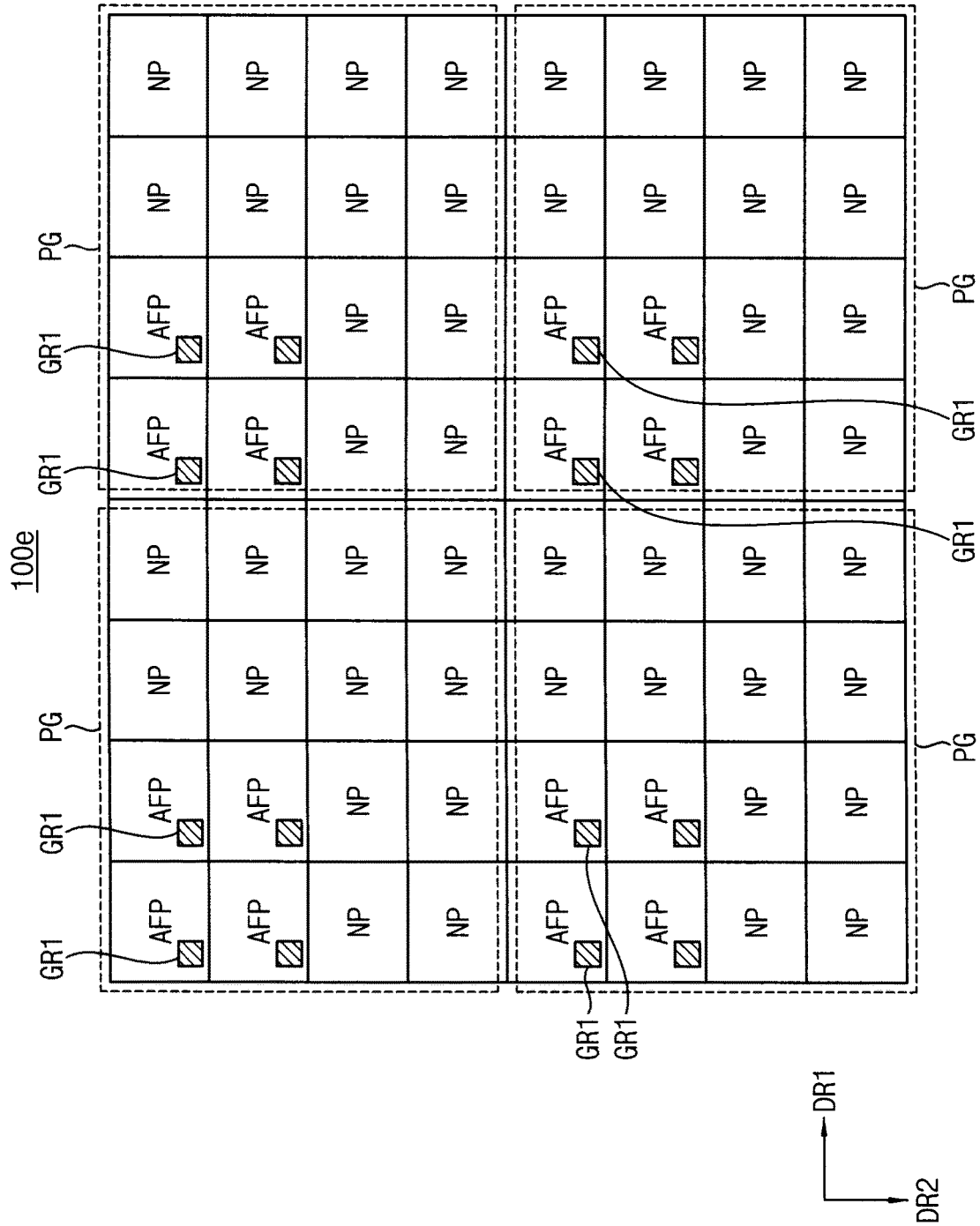
FIG. 25 is a plan view of a pixel array included in an auto-focus image sensor according to example embodiments.

FIG. 25 is a plan view of a pixel array included in an auto-focus image sensor according to example embodiments. FIG. 26 is a circuit diagram illustrating another example of a pixel included in a pixel array included in an auto-focus image sensor according to example embodiments. FIG. 27 is a cross-sectional view of an example of the pixel array included in the auto-focus image sensor of FIG. 25. The descriptions that are repetitive with FIGS. 1, 5, 6 and 7 will be omitted.

Figure 26:
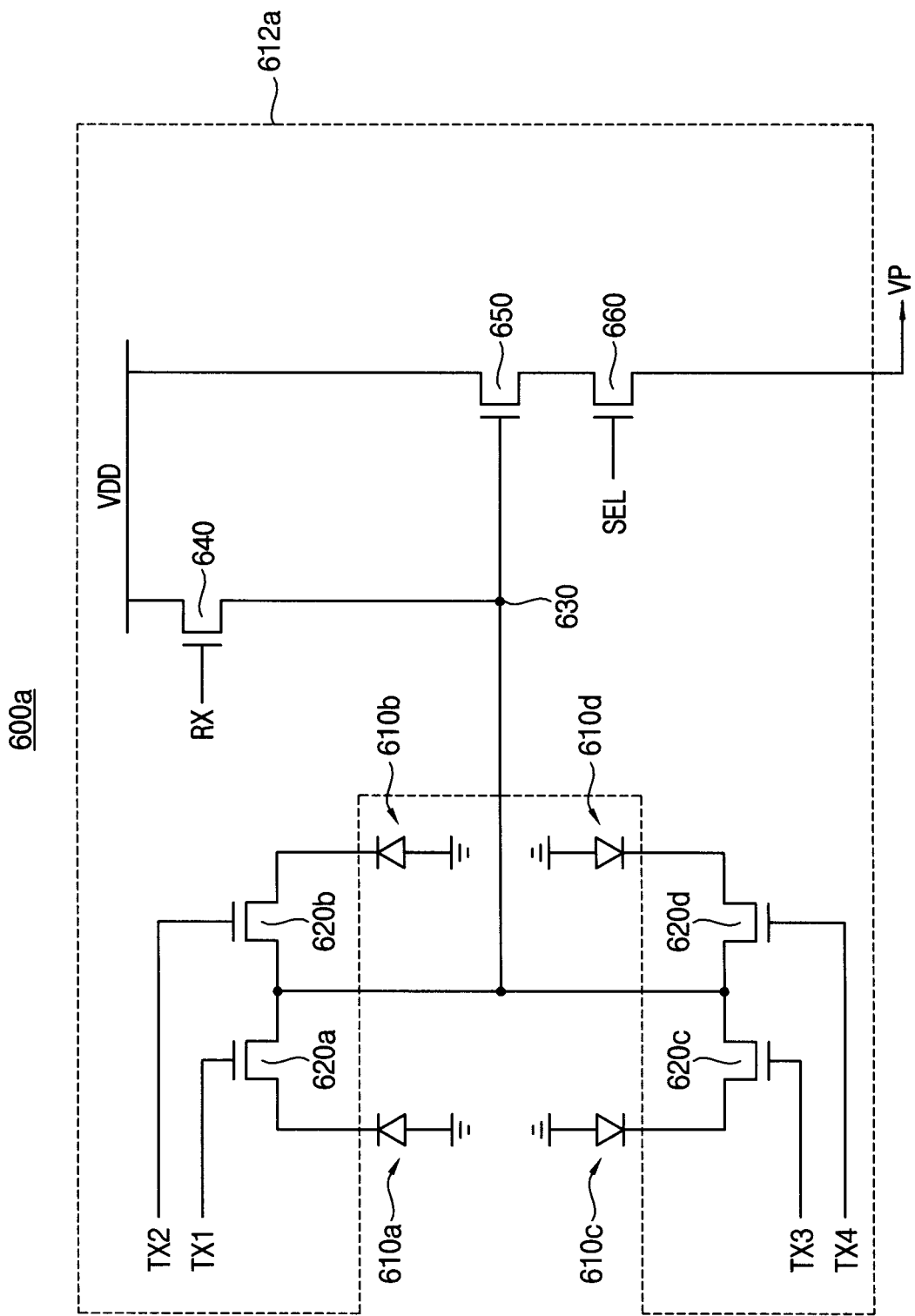
FIG. 26 is a circuit diagram illustrating another example of a pixel included in a pixel array included in an auto-focus image sensor according to example embodiments.
Figure 27:
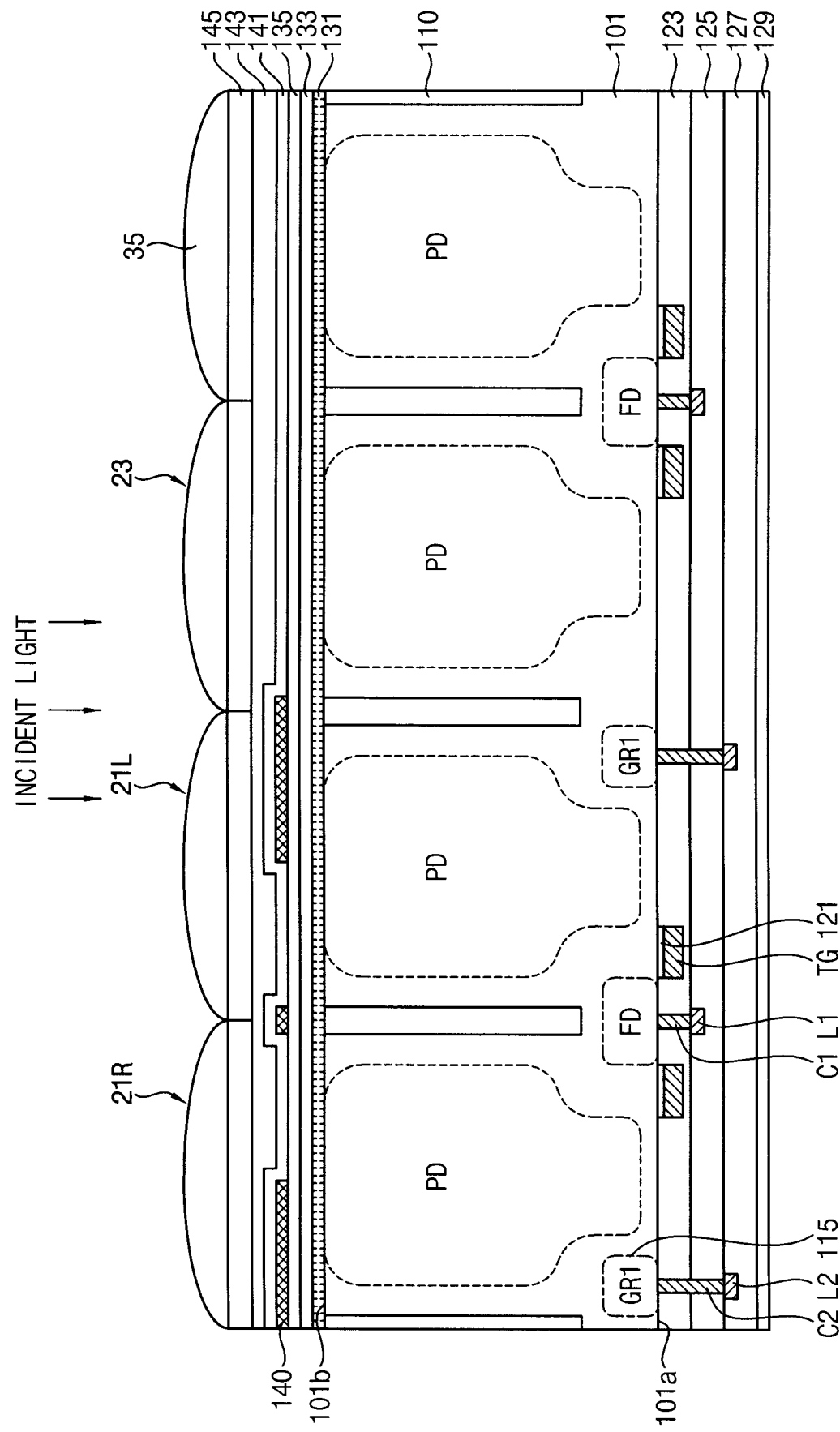
FIG. 27 is a cross-sectional view of an example of the pixel array included in the auto-focus image sensor of FIG. 25.

Referring to FIGS. 25, 26 and 27, examples of FIGS. 25, 26 and 27 may be substantially the same as the examples of FIGS. 1, 5, 6 and 7, except that some of the plurality of pixels AFP and NP adjacent to each other share the floating diffusion region FD in FIGS. 25, 26 and 27.

In a pixel array 100e included in an auto-focus image sensor, the floating diffusion region FD may be shared by four pixels adjacent to each other. For example, as illustrated in FIG. 26, first, second, third and the fourth pixels 600a include a first photoelectric conversion part 610a, a second photoelectric conversion part 610b, a third photoelectric conversion part 610c, and a fourth photoelectric conversion part 610d, and a signal generation part 612a shared by the first, the second, the third and the fourth photoelectric conversion parts 610a, 610b, 610c and 610d.

The signal generation part 612a may include first, second, third and fourth transfer transistors 620a, 620b, 620c and 620d, a floating diffusion node 630, a reset transistor 640, a driving transistor 650 and a selection transistor 660. The first, the second, the third and the fourth transfer transistors 620a, 620b, 620c and 620d may be connected to the first, the second, the third and the fourth photoelectric conversion parts 610a, 610b, 610c and 610d, respectively, and receive first, second, third and fourth transfer signals TX1, TX2, TX3 and TX4, respectively. The floating diffusion node 630 may be connected to the first, the second, the third and the fourth transfer transistors 620*a*, 620*b*, 620*c* and 620*d*. The reset transistor 640 and the driving transistor 650 may be connected to the floating diffusion node 630, and the selection transistor 660 may be connected to the driving transistor 650.

Although FIG. 26 illustrates an example where the signal generation part 612*a* is shared by four pixels adjacent to each other, example embodiments are not limited thereto, and the number of pixels sharing the signal generation part may be changed according to example embodiments.

As illustrated in FIG. 27, as adjacent pixels share the signal generation part 612*a*, one floating diffusion region FD may be disposed between adjacent AF pixels 21R and 21L, and one floating diffusion region FD may be disposed between adjacent normal pixels 23.

In some example embodiments, an arrangement of the ground regions illustrated in FIGS. 25 and 27 may be changed or modified based on the examples as described with reference to FIGS. 18 through 24. In some example embodiments, the pixel array illustrated in FIG. 27 may be changed or modified based on the examples as described with reference to FIGS. 7, 9, 10, 11, 12, 13, 14 and 15, or may be implemented in combination of two or more of the above-described examples.

Figure 28:
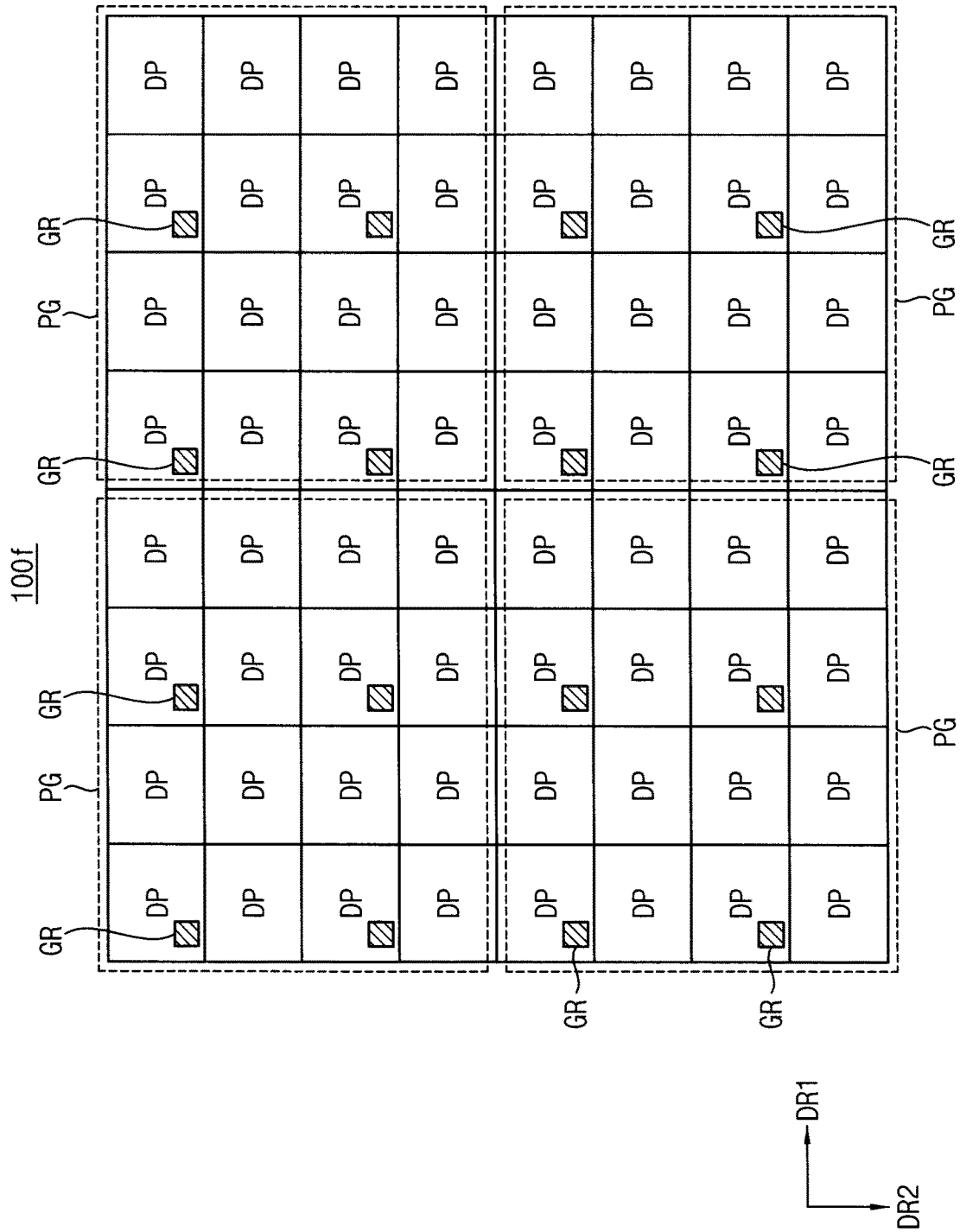
FIG. 28 is a plan view of a pixel array included in an auto-focus image sensor according to example embodiments.
Figure 29:
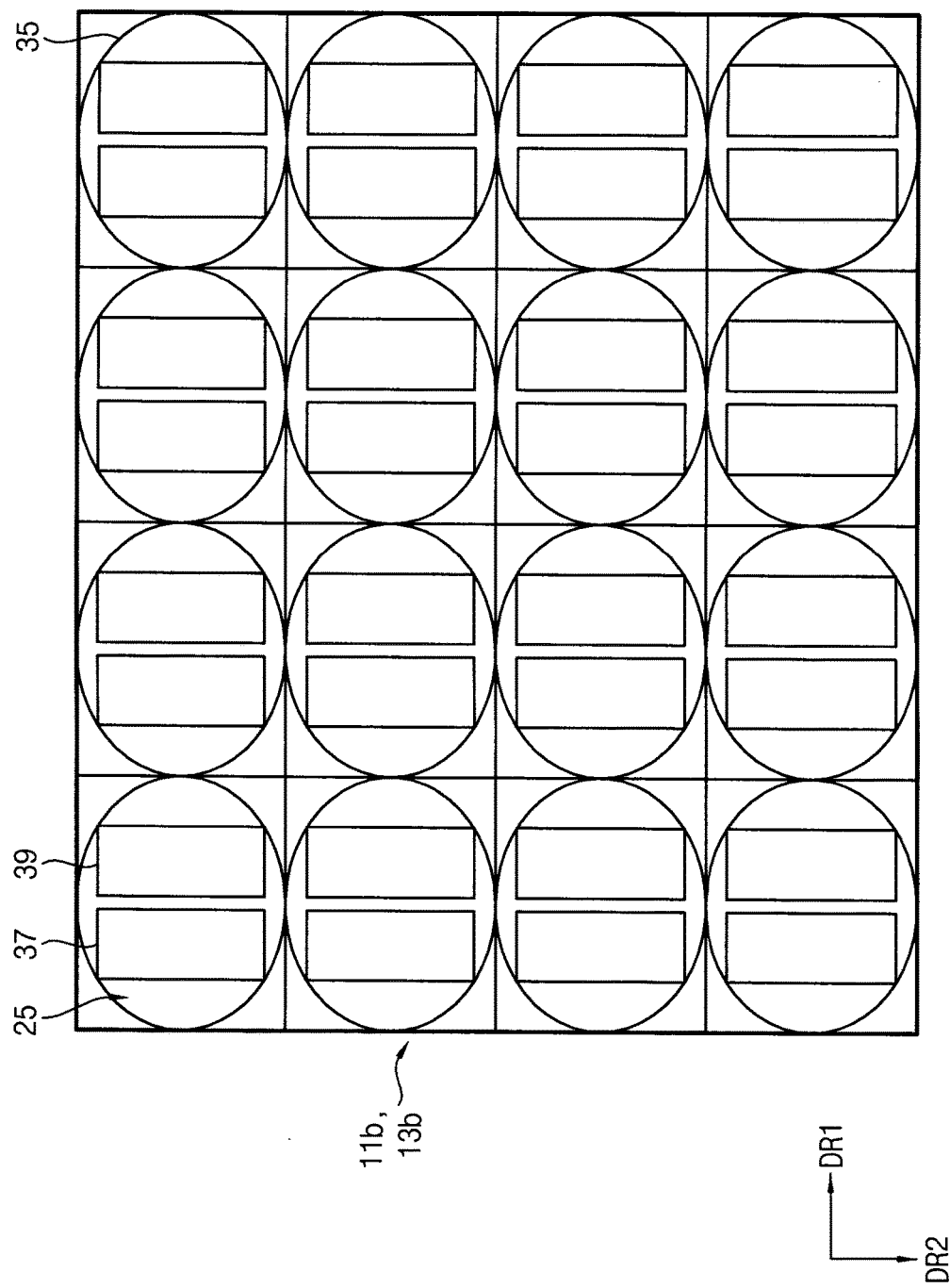
FIG. 29 is a plan view of a layout of a portion of the pixel array included in the auto-focus image sensor of FIG. 28.
Figure 30:
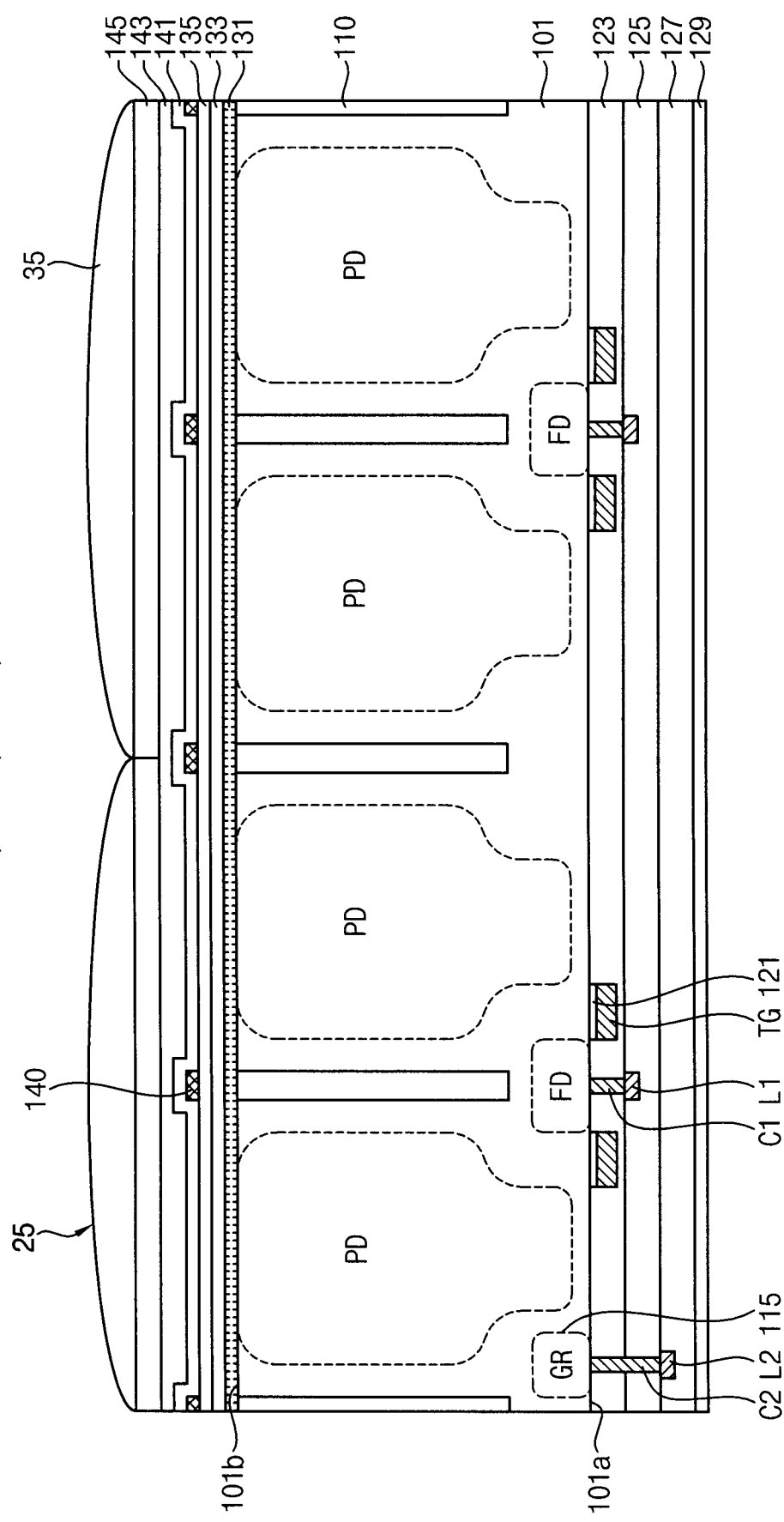
FIG. 30 is a cross-sectional view of an example of the pixel array included in the auto-focus image sensor of FIG. 28.

FIG. 28 is a plan view of a pixel array included in an auto-focus image sensor according to example embodiments. FIG. 29 is a plan view of a layout of a portion of the pixel array included in the auto-focus image sensor of FIG. 28. FIG. 30 is a cross-sectional view of an example of the pixel array included in the auto-focus image sensor of FIG. 28. The descriptions that are repetitive with FIGS. 1, 2, 6 and 7 will be omitted.

Referring to FIGS. 28, 29 and 30, a pixel array 100*f* included in an auto-focus image sensor includes a substrate 101, a plurality of pixels DP, a deep device isolation region 110 and a plurality of ground regions GR. The substrate 101, the deep device isolation region 110 and the other elements may be substantially the same as described with reference to FIGS. 6 and 7.

Although the plurality of first pixels AFP configured to detect a phase difference and the plurality of second pixels NP configured to detect an image are separate and distinguished from each other in the examples described with reference to FIGS. 1 through 27, each of the plurality of pixels DP may perform both a function of detecting a phase difference and a function of detecting an image in an example of FIGS. 28, 29 and 30. The plurality of pixels DP may be referred to as dual pixels.

As illustrated in FIG. 29, a focus detecting region 11*b* and an image detecting region 13*b* of the pixel array 100*f* included in the auto-focus image sensor may be the same region. A third opening 37 and a fourth opening 39 may be formed on each of the dual pixels 25 by a light shielding pattern. The third opening 37 and the fourth opening 39 may be similar to the first openings 31 in FIG. 2, except that the third opening 37 and the fourth opening 39 are formed under a single micro lens 35. Light corresponding to a left side may be received through the third opening 37, and light corresponding to a right side may be received through the fourth opening 39.

As illustrated in FIG. 30, each of the dual pixels 25 may include two photoelectric conversion regions PD. The photoelectric conversion region PD on the left side may be disposed corresponding to the third opening 37 and may operate similarly to the second AF pixel L in FIGS. 2 and 7. The photoelectric conversion region PD on the right side may be disposed corresponding to the fourth opening 39 and may operate similarly to the first AF pixel R in FIGS. 2 and 7. In addition, an image signal may be generated by summing signals from two photoelectric conversion regions PD. It may also be described that one photoelectric conversion region PD is defined as one subpixel so that one micro lens 35 is shared by two subpixels.

The plurality of ground regions GR may be disposed adjacent to only at least some of the plurality of pixels DP. The number of the plurality of ground regions GR may be less than the number of the plurality of pixels DP, and only each of some of the plurality of pixels DP may include one of the plurality of ground regions GR.

Figure 31:
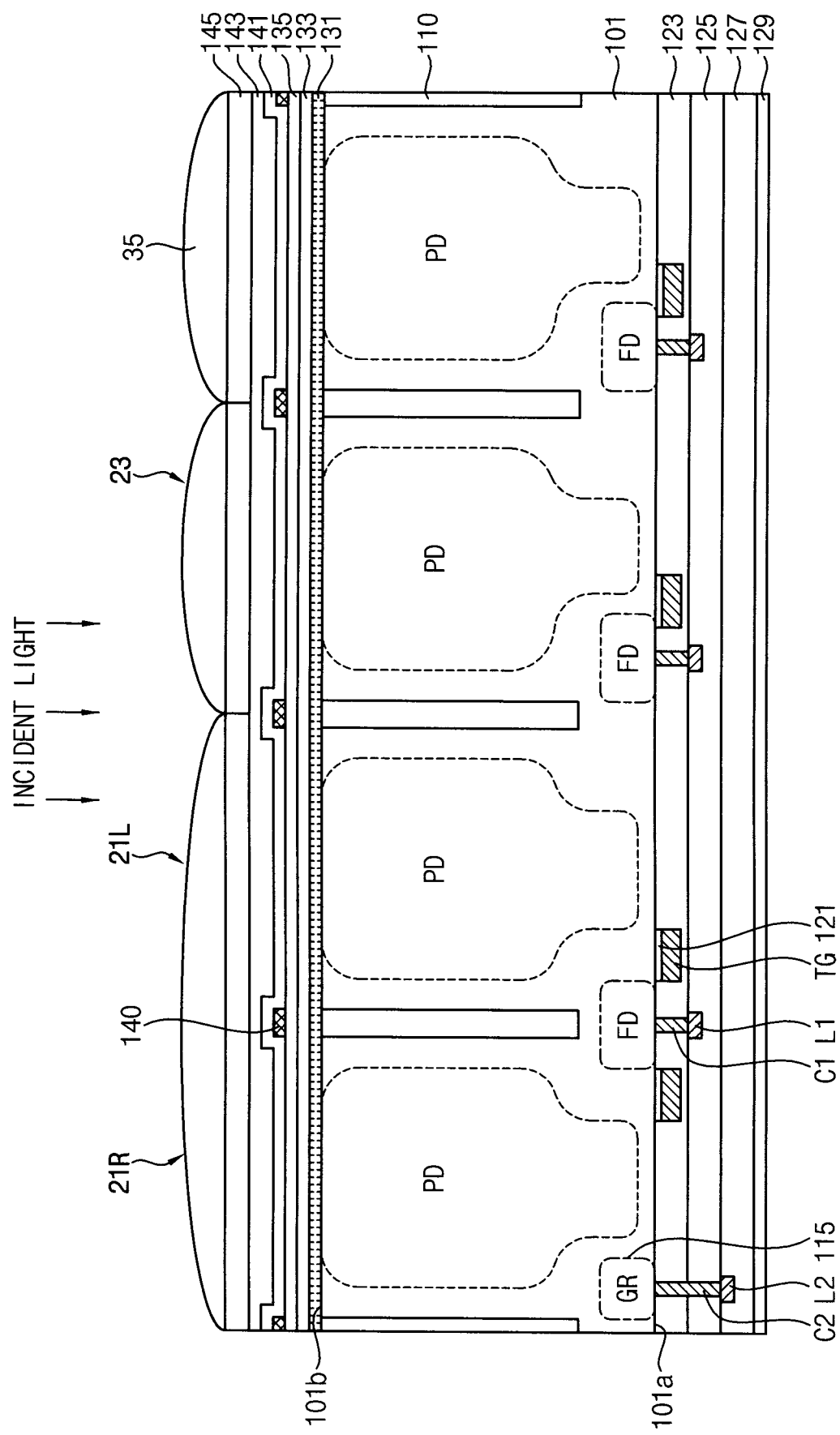
FIG. 31 is a cross-sectional view of an example of a pixel array included in an auto-focus image sensor according to example embodiments.

FIG. 31 is a cross-sectional view of an example of a pixel array included in an auto-focus image sensor according to example embodiments.

Referring to FIG. 31, the first pixels AFP adjacent to each other (e.g., the AF pixels 21R and 21L) may share one micro lens 35, and each of the second pixels NP (e.g., the normal pixels 23) may include one micro lens 35 for each pixel. In other words, an example of FIG. 31 may have a structure in which the examples described with reference to FIGS. 1 through 27 and the example described with reference to FIGS. 28 through 30 are combined.

In some example embodiments, an arrangement of the ground regions illustrated in FIGS. 28 through 31 may be changed or modified based on the examples as described with reference to FIGS. 18 through 24. In some example embodiments, the pixel array illustrated in FIGS. 28 through 31 may be changed or modified based on the examples as described with reference to FIGS. 7, 9, 10, 11, 12, 13, 14 and 15, or may be implemented in combination of two or more of the above-described examples.

Figure 32:
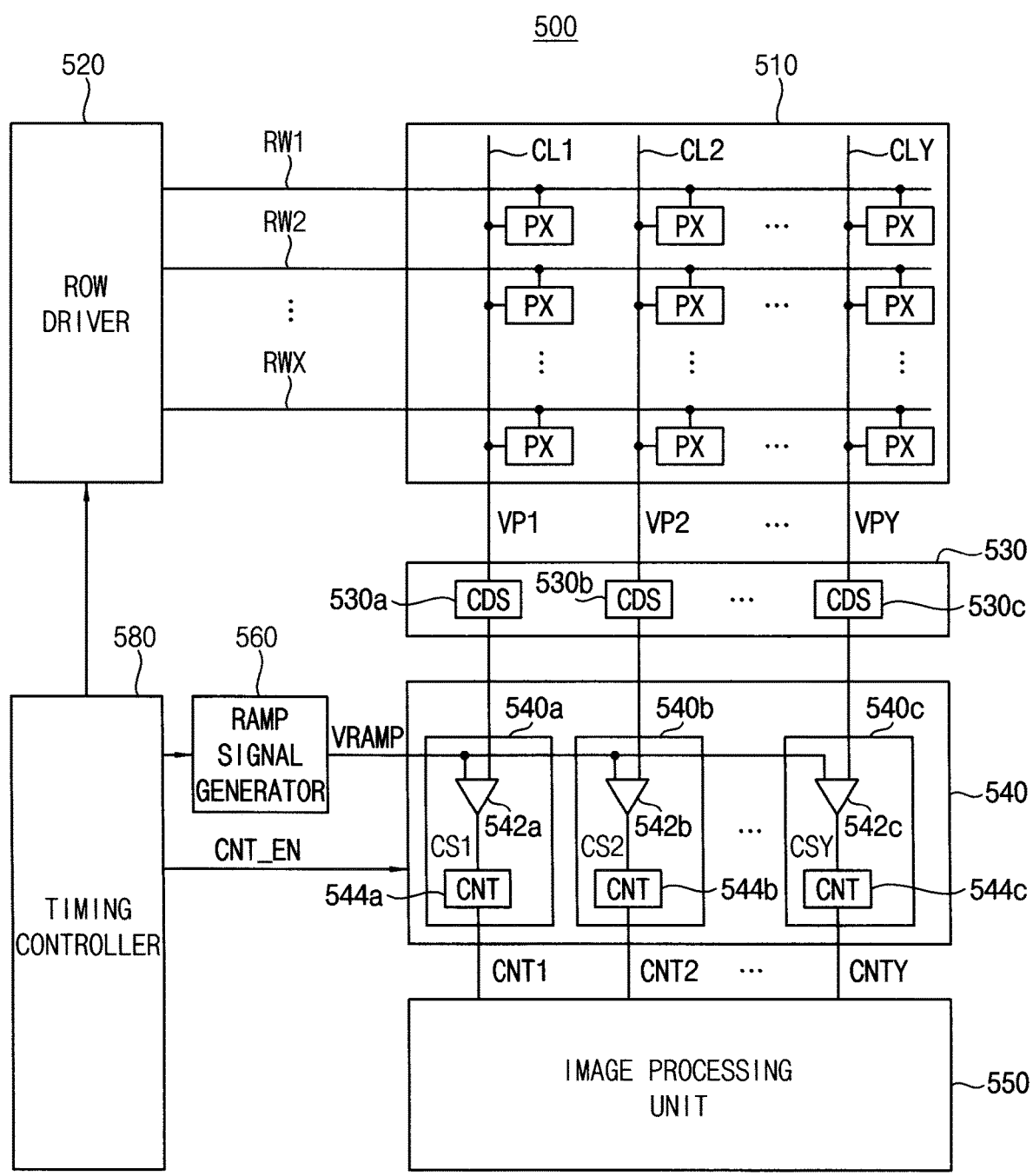
FIG. 32 is a block diagram illustrating an auto-focus image sensor according to example embodiments.

FIG. 32 is a block diagram illustrating an auto-focus image sensor according to example embodiments.

Referring to FIG. 32, an auto-focus image sensor 500 includes a pixel array 510, a correlated double sampling (CDS) block 530 and an analog-to-digital conversion (ADC) block 540. The auto-focus image sensor 500 may further include a row driver 520, an image processing unit 550, a ramp signal generator 560 and a timing controller 580.

The pixel array 510 includes a plurality of pixels or unit pixels PX that are arranged in a matrix formation. Each of the plurality of unit pixels PX may be connected to a respective one of a plurality of rows RW1, RW2, ..., RWX and a respective one of a plurality of columns CL1, CL2, ..., CLY, where each of X and Y is a natural number greater than or equal to two. The pixel array 510 generates a plurality of analog pixel signals VP1, VP2, ..., VPY based on incident light. The pixel array 510 may be the pixel array according to example embodiments described with reference to FIGS. 1 through 31.

The row driver 520 may be connected to the plurality of rows RW1~RWX of the pixel array 510. The row driver 520 may generate driving signals to drive the plurality of rows RW1~RWX. For example, the row driver 520 may drive the plurality of unit pixels PX included in the pixel array 510 row by row.

The correlated double sampling block 530 may include a plurality of correlated double sampling circuits (CDSs) 530*a*, 530*b*, ..., 530*c*. The plurality of correlated double sampling circuits 530*a*~530*c* may be connected to the plurality of columns CL1~CLY of the pixel array 510. The plurality of correlated double sampling circuits 530*a*~530*c* may perform a correlated double sampling operation on the plurality of analog pixel signals VP1~VPY output from the pixel array 510.

The analog-to-digital conversion block 540 includes a plurality of analog-to-digital converters 540a, 540b, . . . , 540c. The plurality of analog-to-digital converters 540a~540c are connected to the plurality of columns CL1~CLY of the pixel array 510 via the plurality of correlated double sampling circuits 530a~530c. The plurality of analog-to-digital converters 540a~540c perform a column analog-to-digital conversion operation that converts the plurality of analog pixel signals VP1~VPY (e.g., a plurality of correlated double sampled analog pixel signals output from the plurality of correlated double sampling circuits 530a~530c) into a plurality of digital signals CNT1, CNT2, . . . , CNTY in parallel (e.g., simultaneously or concurrently).

Each of the plurality of analog-to-digital converters 540a~540c may include a respective one of a plurality of comparators 542a, 542b, . . . , 542c and a respective one of a plurality of counters (CNTs) 544a, 544b, . . . , 544c. For example, the first analog-to-digital converter 540a may include the first comparator 542a and the first counter 544a. The first comparator 542a may compare the first analog pixel signal VP1 (e.g., the correlated double sampled first analog pixel signal output from the first correlated double sampling circuit 530a) with a ramp signal VRAMP to generate a first comparison signal CS1. The first counter 544a may count a level transition timing of the first comparison signal CS1 to generate the first digital signal CNT1.

Operations of the correlated double sampling block 530 and the analog-to-digital conversion block 540 may be performed on the plurality of unit pixels PX included in the pixel array 510 row by row.

The plurality of correlated double sampling circuits 530a~530c and the plurality of analog-to-digital converters 540a~540c may form a plurality of column driving circuits. For example, the first correlated double sampling circuit 530a and the first analog-to-digital converter 540a may form a first column driving circuit.

The image processing unit 550 may perform an image processing operation based on the plurality of digital signals CNT1~CNTY. For example, an operation of obtaining the AF information using the AF pixels and an operation of obtaining the image using the normal pixels may be performed by the image processing unit 550.

Figure 33:
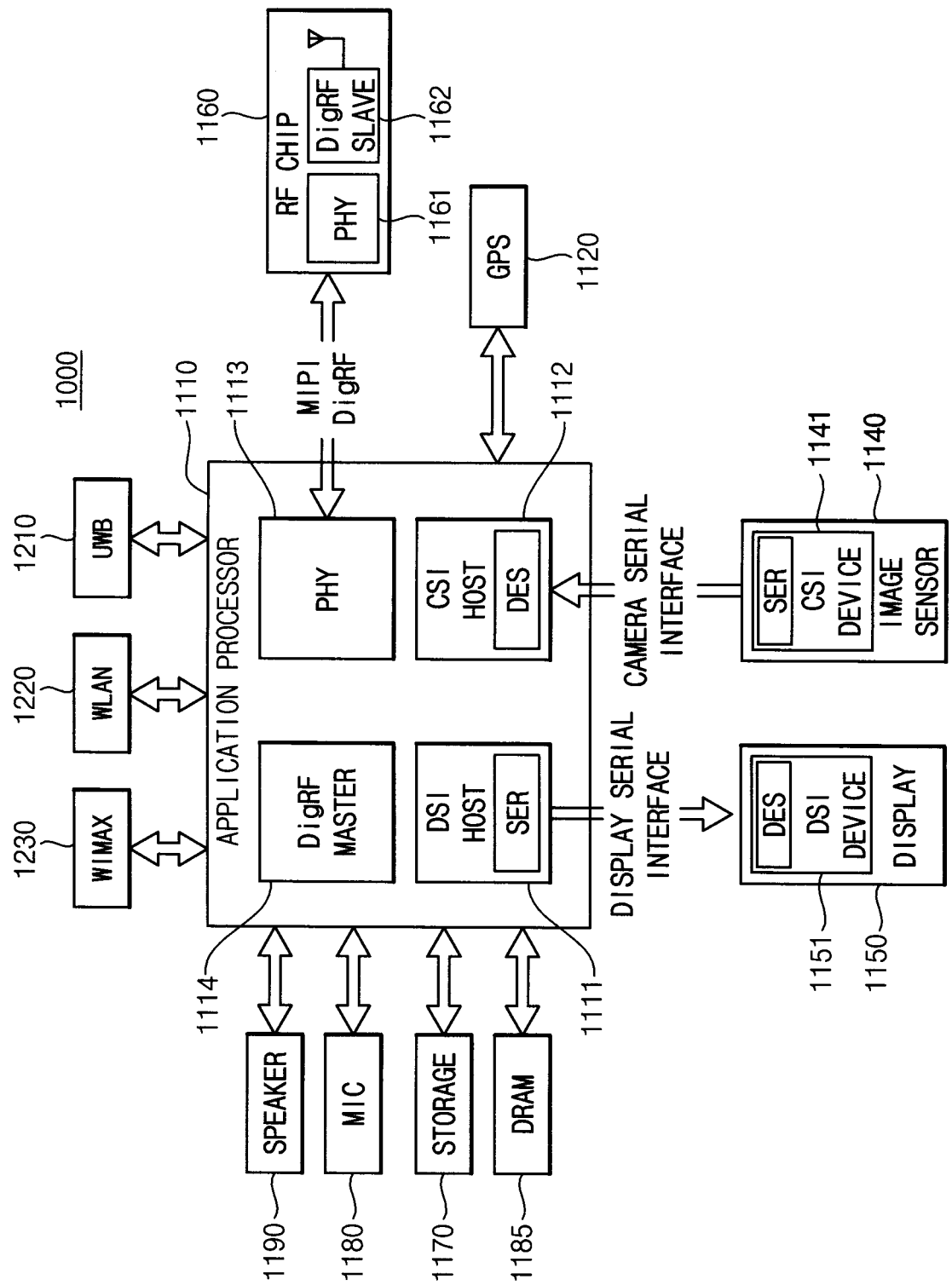
FIG. 33 is a block diagram illustrating an electronic system including an auto-focus image sensor according to example embodiments.

In some example embodiments, the image processing unit 550 may be omitted, and the above-described image processing operation may be performed by an external processor (e.g., an application processor 1110 in FIG. 33).

The ramp signal generator 560 may generate the ramp signal VRAMP. The timing controller 580 may control overall operation timings of the auto-focus image sensor 500, and may generate control signals including a count enable signal CNT_EN, a clock signal (not shown), etc.

FIG. 33 is a block diagram illustrating an electronic system including an auto-focus image sensor according to example embodiments.

Referring to FIG. 33, an electronic system 1000 may be implemented as a data processing device that uses or supports a mobile industry processor interface (MIPI) interface. The electronic system 1000 may include an application processor 1110, an auto-focus image sensor 1140, a display device 1150, etc. The electronic system 1000 may further include a radio frequency (RF) chip 1160, a global positioning system (GPS) 1120, a storage 1170, a microphone (MIC) 1180, a dynamic random access memory (DRAM) 1185 and a speaker 1190. In addition, the electronic system 1000 may perform communications using an ultra wideband (UWB) 1210, a wireless local area network (WLAN) 1220, a worldwide interoperability for microwave access (WIMAX) 1230, etc.

The application processor 1110 may be a controller or a processor that controls an operation of the auto-focus image sensor 1140. The auto-focus image sensor 1140 may be the auto-focus image sensor according to example embodiments.

The application processor 1110 may include a display serial interface (DSI) host 1111 that performs a serial communication with a DSI device 1151 of the display device 1150, a camera serial interface (CSI) host 1112 that performs a serial communication with a CSI device 1141 of the auto-focus image sensor 1140, a physical layer (PHY) 1113 that performs data communications with a PHY 1161 of the RF chip 1160 based on a MIPI DigRF, and a DigRF MASTER 1114 that controls the data communications of the physical layer 1161. A DigRF SLAVE 1162 of the RF chip 1160 may be controlled through the DigRF MASTER 1114.

In some example embodiments, the DSI host 1111 may include a serializer (SER), and the DSI device 1151 may include a deserializer (DES). In some example embodiments, the CSI host 1112 may include a deserializer (DES), and the CSI device 1141 may include a serializer (SER).

The inventive concept may be applied to various electronic devices and/or systems including the auto-focus image sensors. For example, the inventive concept may be applied to systems such as a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, etc.

The pixel array and the auto-focus image sensor according to example embodiments may be implemented such that the first pixels for obtaining auto-focus (AF) information and the second pixels for obtaining image information are disposed in one pixel array. In addition, the first ground regions for the purpose of reducing the dark current may be disposed only in the first pixels and not in the second pixels. Accordingly, photoelectric conversion regions included in the second pixels may be expanded or enlarged even if a size of the pixels shrinks, and thus the FWC characteristics may be improved or enhanced.

In addition, example embodiments may be applied to a case where the first ground regions are disposed only in some of the first pixels, a case where the second ground regions are additionally arranged in some of the second pixels, and a case where one pixel obtains AF information and image information together.

The foregoing is illustrative of example embodiments and is not to be construed as limiting. Although some example embodiments have been described, those skilled in the art will readily appreciate that many modifications are possible in the example embodiments without materially departing from the novel teachings and advantages of the disclosure. Accordingly, all such modifications are intended to be included within the scope of the disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the disclosure.

What is claimed is:

1. A pixel array included in an auto-focus image sensor, comprising:
a substrate including a first surface and a second surface opposite to the first surface, a gate electrode being disposed on the first surface;
a plurality of pixels in the substrate, the plurality of pixels including a plurality of first pixels configured to detect a phase difference and a plurality of second pixels configured to detect an image;
a deep device isolation region in the substrate, the deep device isolation region extending substantially vertically from a first end of the deep device isolation region to a second end of the deep device isolation region to isolate the plurality of pixels from each other, the first end being in contact with the second surface and the second end not being in contact with the first surface;
a plurality of first ground regions adjacent to the first surface in the substrate, each of the plurality of first ground regions being included in a corresponding one of the plurality of first pixels; and
a light shielding pattern on the second surface of the substrate, the light shielding pattern being configured such that an amount of first light incident on each of the plurality of first pixels being smaller than an amount of second light incident on each of the plurality of second pixels,
wherein a ground voltage is applied to each of the plurality of first ground regions through a contact from a signal line formed on the first surface of the substrate, and the ground voltage applied to each of the plurality of first ground regions is transferred to at least some of the plurality of second pixels via a space between the deep device isolation region and the first surface of the substrate,
wherein the space is provided between the second end of the deep device isolation region and the first surface, and
wherein the at least some of the plurality of second pixels do not include any ground region.

2. The pixel array of claim 1, wherein:
a number of the plurality of first ground regions is equal to a number of the plurality of first pixels.

3. The pixel array of claim 1, wherein:
a number of the plurality of first ground regions is less than a number of the plurality of first pixels.

4. The pixel array of claim 1, wherein:
the substrate contains impurities of a first-conductivity type, and
the plurality of first ground regions contain a same type of impurities as the substrate at a density higher than that of the substrate.

5. The pixel array of claim 1, further comprising:
a plurality of second ground regions adjacent to the first surface in the substrate and located in remaining second pixels other than the at least some of the plurality of second pixels, and a size of each of the plurality of second ground regions is smaller than a size of each of the plurality of first ground regions.

6. The pixel array of claim 1, wherein:
the deep device isolation region has a mesh structure,
the light shielding pattern has a mesh structure overlapping the deep device isolation region in a plan view, and
an area of the light shielding pattern on each of the plurality of first pixels is greater than an area of the light shielding pattern on each of the plurality of second pixels.

7. The pixel array of claim 6, wherein the light shielding pattern includes:
a plurality of first openings at least partially exposing the plurality of first pixels.

8. The pixel array of claim 1, further comprising:
a plurality of color filters on the light shielding pattern; and
a plurality of micro lenses on the plurality of color filters.

9. The pixel array of claim 1, wherein a depth of the deep device isolation region is smaller than a thickness of the substrate.

10. The pixel array of claim 1, further comprising:
a polysilicon pattern in the deep device isolation region.

11. The pixel array of claim 1, wherein each of the plurality of pixels includes:
a photoelectric conversion region in which photoelectric conversion is performed based on incident light; and
a floating diffusion region configured to accumulate photo-charges collected in the photoelectric conversion region.

12. The pixel array of claim 11, wherein the floating diffusion region is shared by at least two adjacent pixels among the plurality of pixels.

13. The pixel array of claim 11, wherein the photoelectric conversion region included in the plurality of second pixels is larger than the photoelectric conversion region included in the plurality of first pixels.

14. The pixel array of claim 1, wherein each of the plurality of first pixels and each of the plurality of second pixels have a photoelectric conversion region, and a size of the photoelectric conversion region of the plurality of second pixels is larger than a size of the photoelectric conversion region of the plurality of first pixels.

15. An auto-focus image sensor comprising:
a pixel array configured to generate a plurality of analog pixel signals based on incident light, the plurality of analog pixel signals representing phase difference information and image information; and
a plurality of column driving circuits connected to a plurality of columns of the pixel array, the plurality of column driving circuits configured to convert the plurality of analog pixel signals into a plurality of digital signals,
wherein the pixel array includes:
a substrate including a first surface and a second surface opposite to the first surface, a gate electrode being disposed on the first surface;
a plurality of pixels in the substrate, the plurality of pixels including a plurality of first pixels configured to detect a phase difference and a plurality of second pixels configured to detect an image;
a deep device isolation region in the substrate, the deep device isolation region extending substantially vertically from a first end of the deep device isolation region to a second end of the deep device isolation region to isolate the plurality of pixels from each other, the first end being in contact with the second surface and the second end not being in contact with the first surface;
a plurality of first ground regions adjacent to the first surface in the substrate, each of the plurality of first ground regions being included in a corresponding one of the plurality of first pixels; and a light shielding pattern on the second surface of the substrate, the light shielding pattern being configured such that an amount of first light incident on each of the plurality of first pixels being smaller than an amount of second light incident on each of the plurality of second pixels, wherein a ground voltage is applied to each of the plurality of first ground regions through a contact from a signal line formed on the first surface of the substrate, and the ground voltage applied to each of the plurality of first ground regions is transferred to at least some of the plurality of second pixels via a space between the deep device isolation region and the first surface of the substrate, and wherein the space is provided between the second end of the deep device isolation region and the first surface and wherein the at least some of the plurality of second pixels do not include any ground region.

16. The auto-focus image sensor of claim 15, wherein a number of the plurality of first ground regions is equal to a number of the plurality of first pixels.

17. The auto-focus image sensor of claim 15, wherein a number of the plurality of first ground regions is less than a number of the plurality of first pixels.

18. The auto-focus image sensor of claim 15, wherein the pixel array further includes:

a plurality of second ground regions adjacent to the first surface in the substrate and located in remaining second pixels other than the at least some of the plurality of second pixels, and a size of each of the plurality of second ground regions is smaller than a size of each of the plurality of first ground regions.

* * * * *